US012439672B2

(12) United States Patent
Xie et al.

(10) Patent No.: US 12,439,672 B2
(45) Date of Patent: Oct. 7, 2025

(54) SEMICONDUCTOR BACKSIDE CONTACT STRUCTURE WITH INCREASED CONTACT AREA

(71) Applicant: International Business Machines Corporation, Armonk, NY (US)

(72) Inventors: Ruilong Xie, Niskayuna, NY (US); Kangguo Cheng, Schenectady, NY (US); Julien Frougier, Albany, NY (US); Chanro Park, Clifton Park, NY (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 536 days.

(21) Appl. No.: 17/932,919

(22) Filed: Sep. 16, 2022

(65) Prior Publication Data

US 2024/0096983 A1    Mar. 21, 2024

(51) Int. Cl.
*H10D 64/23*     (2025.01)
*H01L 23/528*    (2006.01)
(Continued)

(52) U.S. Cl.
CPC ....... *H10D 64/256* (2025.01); *H01L 23/5286* (2013.01); *H10D 62/121* (2025.01);
(Continued)

(58) Field of Classification Search
CPC .... H10D 64/256; H10D 84/85; H10D 62/151; H10D 62/121; H10D 64/01; H10D 30/6735; H01L 23/5286
See application file for complete search history.

(56) References Cited

U.S. PATENT DOCUMENTS 7,265,399 B2   9/2007   Sriram
10,998,413 B2  5/2021   Hiblot
(Continued)

FOREIGN PATENT DOCUMENTS

EP    3653569 A1    5/2020

OTHER PUBLICATIONS

Ernst, et al., "Raised source/drain (RSD) for 50nm MOSFETs—Effect of epitaxy layer thickness on short channel effects", 2003 33rd Conference on European Solid-State Device Research (ESSDERC '03), Oct. 2003, pp. 233-226, <https://www.researchgate.net/publication/4050144_Raised_sourcedrain_RSD_for_50nm_MOSFETs_Effect_of_epitaxy_layer_thickness_on_short_channel_effects>.

*Primary Examiner* — Changhyun Yi
(74) *Attorney, Agent, or Firm* — James L. Olsen

(57) ABSTRACT

A semiconductor structure having a backside contact structure with increased contact area includes a plurality of source/drain regions within a field effect transistor, each of the plurality of source/drain regions includes a top portion having an inverted V-shaped area. A backside power rail is electrically connected to at least one source/drain region through a backside metal contact. The backside metal contact wraps around a top portion of the at least one source/drain region. A tip of the top portion of the plurality of source/drain regions points towards the backside power rail with the top portion of the at least one source/drain region being in electric contact with the backside metal contact. A first epitaxial layer is in contact with a top portion of at least another source/drain region adjacent to the at least one source/drain region for electrically isolating the at least another source/drain region from the backside power rail.

20 Claims, 29 Drawing Sheets

Section X

(51) Int. Cl.
*H10D 62/10* (2025.01)
*H10D 62/13* (2025.01)
*H10D 64/01* (2025.01)
*H10D 84/85* (2025.01)

(52) U.S. Cl.
CPC ........... *H10D 62/151* (2025.01); *H10D 64/01* (2025.01); *H10D 84/85* (2025.01)

(56) References Cited

U.S. PATENT DOCUMENTS

| | | | |
|---|---|---|---|
| 2020/0058562 A1* | 2/2020 | Wu | H10D 84/038 |
| 2021/0111115 A1 | 4/2021 | Patrick | |
| 2021/0134721 A1 | 5/2021 | Chiang | |
| 2021/0202319 A1* | 7/2021 | Agrawal | H10D 30/6729 |
| 2021/0202385 A1 | 7/2021 | Huang | |
| 2021/0305252 A1 | 9/2021 | Chiang | |
| 2021/0305381 A1 | 9/2021 | Chiang | |
| 2021/0343639 A1* | 11/2021 | Wang | H01L 21/76897 |
| 2021/0343646 A1 | 11/2021 | Chen | |
| 2021/0351303 A1 | 11/2021 | Ju | |
| 2021/0376071 A1 | 12/2021 | Liu | |
| 2021/0376093 A1 | 12/2021 | Chu | |
| 2021/0391421 A1 | 12/2021 | Chu | |
| 2022/0148964 A1 | 5/2022 | Chen | |

\* cited by examiner

Section Y1

Section Y1

Section Y1

Section X

Section Y2

Section Y1

Section X

Section Y2

Section Y1

Section X

Section Y2

Section Y1

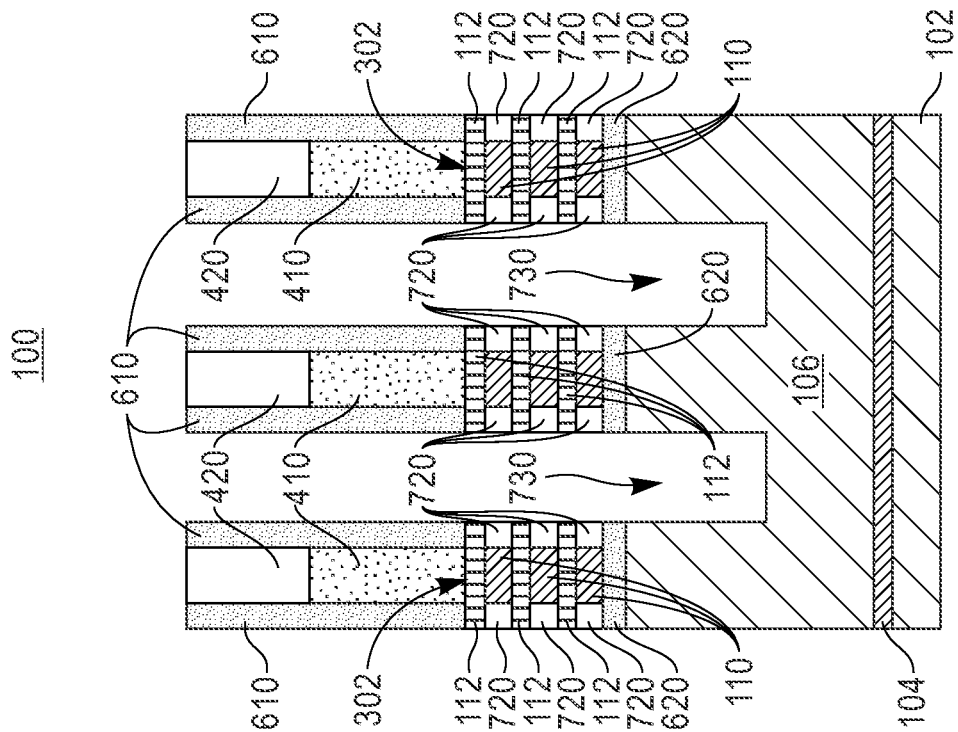
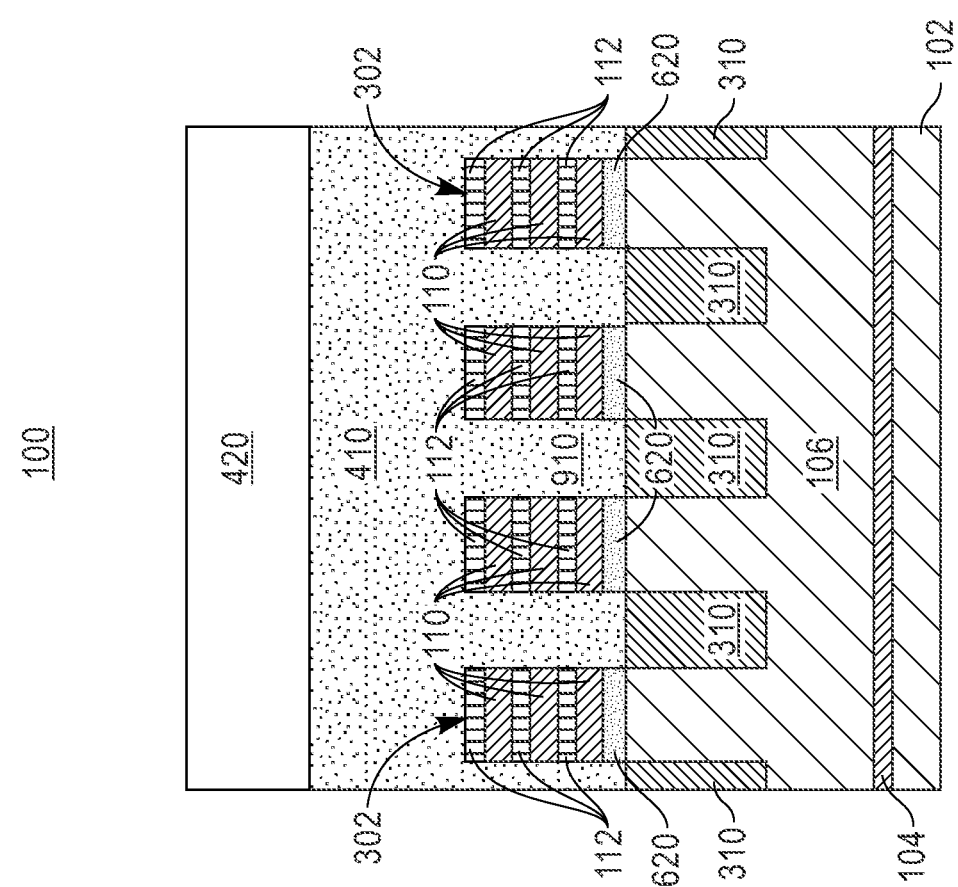
FIG. 7C
Section X
FIG. 7B
Section Y2

Section Y1

Section X

Section Y2

Section Y1

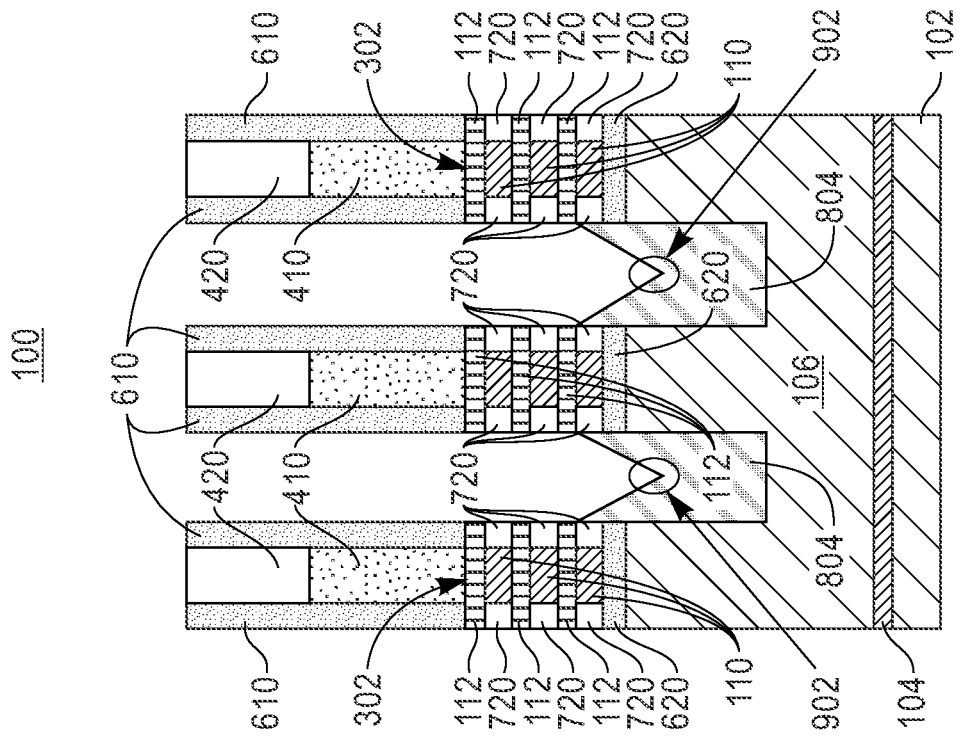
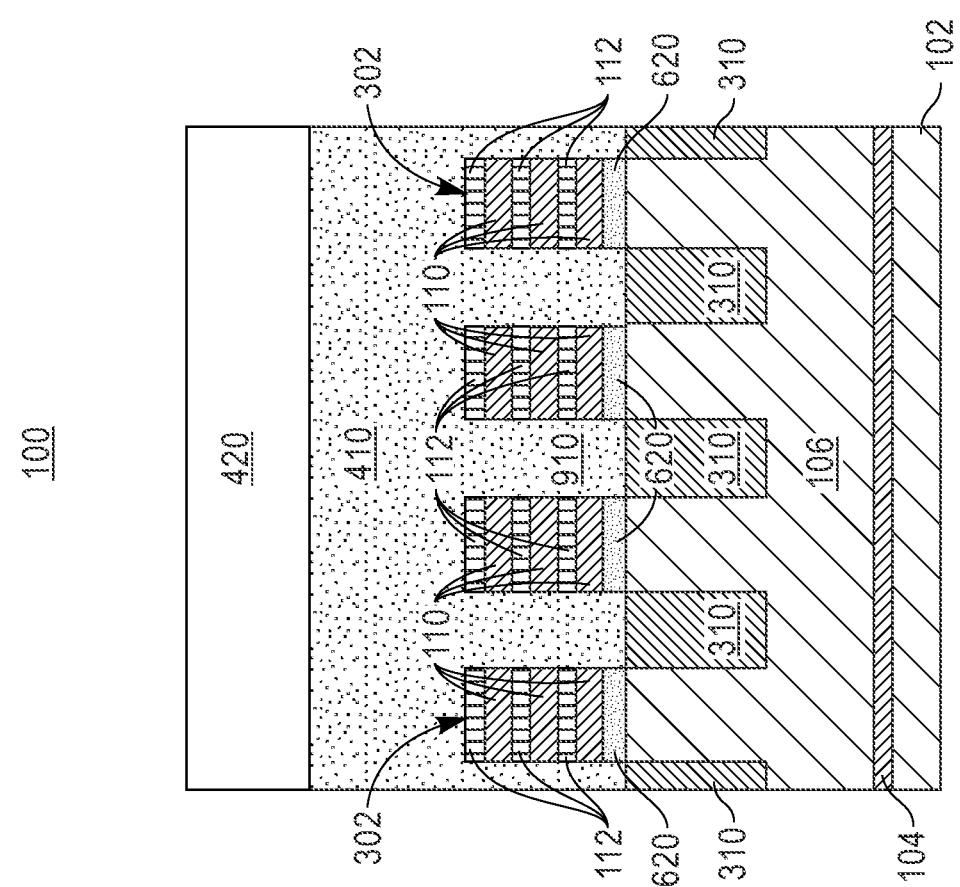
FIG. 9C
Section X
FIG. 9B
Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

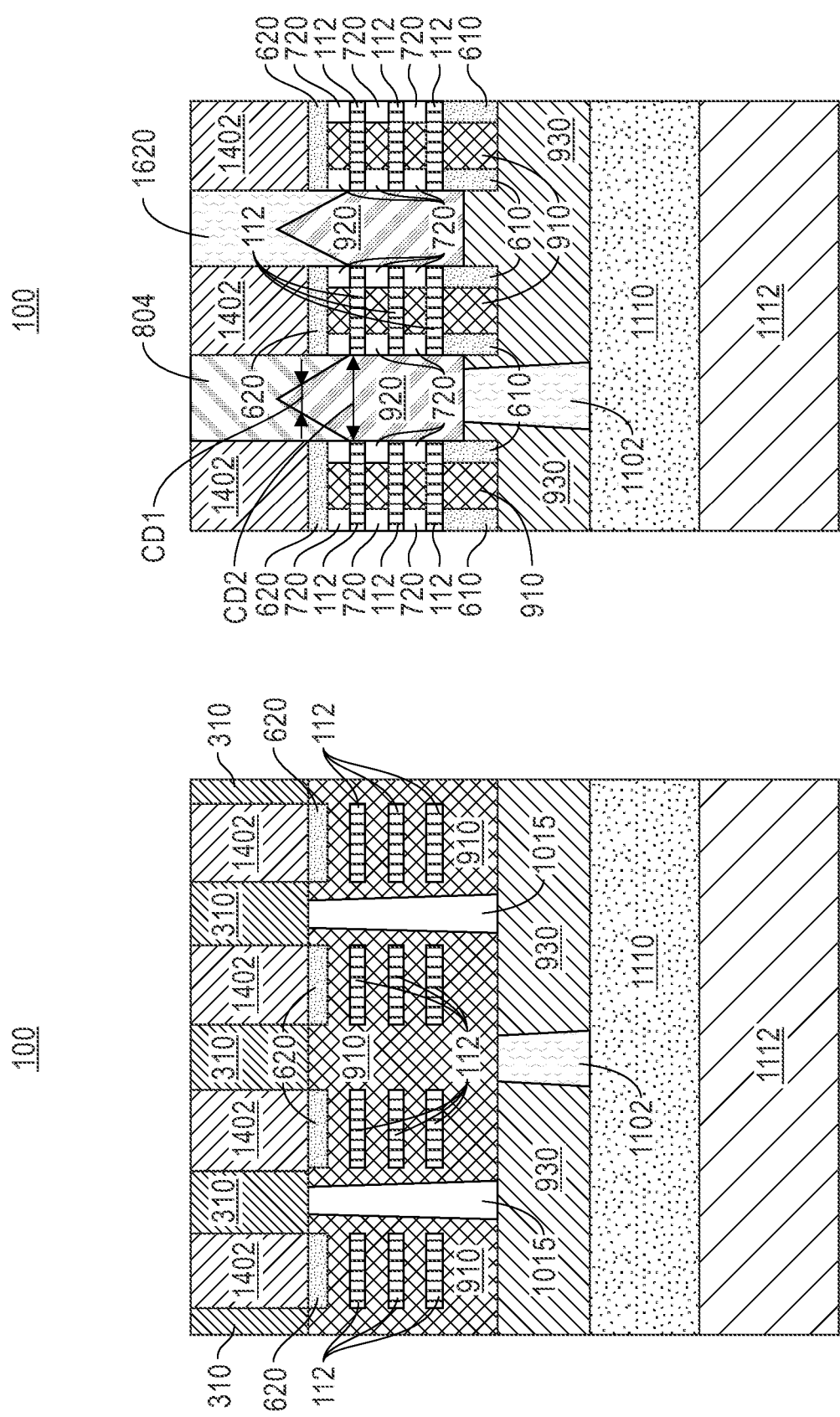

Section Y1

Section X

Section Y2

SEMICONDUCTOR BACKSIDE CONTACT STRUCTURE WITH INCREASED CONTACT AREA

BACKGROUND

The present invention generally relates to the field of semiconductor devices, and more particularly to power delivery to active devices.

Modern integrated circuits (IC) are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts. Power is provided to the integrated circuits through power rails, which are in the metal layers of integrated circuits. For example, the bottom metal layer ($M_0$ or $M_1$) may include a plurality of metal lines such as VDD power rails and VSS power rails.

As ICs continue to scale downward in size, backside power rails (BPRs), i.e., power rails that are formed in the backside of the wafer, usually under the transistor "fins", and backside power delivery ("backside" is below the transistor substrate) have been proposed to alleviate design challenges and enable technology scaling beyond the 5 nm technology node. The BPR technology can free up resources for dense logic connections that limit modern processor performance, enable further scaling of a standard logic cell by removing the overhead in the area occupied by the power rails, and allow thicker low-resistance power rails that enable lower voltage (IR) drops. Although existing approaches in semiconductor fabrication have been generally adequate for their intended purposes, they have not been entirely satisfactory in all respects. One particular area of interest includes forming metal contacts on the backside of the ICs with reduced contact resistance.

SUMMARY

According to an embodiment of the present disclosure, a semiconductor structure includes a plurality of source/drain regions within a field effect transistor, each of the plurality of source/drain regions includes a top portion having an inverted V-shaped area, a backside power rail electrically connected to at least one source/drain region through a backside metal contact, the backside metal contact wraps around a top portion of the at least one source/drain region, a tip of the top portion of the plurality of source/drain regions points towards the backside power rail, the top portion of the at least one source/drain region is in electric contact with the backside metal contact, and a first epitaxial layer in contact with a top portion of at least another source/drain region adjacent to the at least one source/drain region for electrically isolating the at least another source/drain region from the backside power rail.

According to another embodiment of the present disclosure, a method of forming a semiconductor structure includes forming a field effect transistor including a plurality of source/drain regions, each of the plurality of source/drain regions including a top portion having an inverted V-shaped area, forming a backside power rail electrically connected to at least one source/drain region through a backside metal contact, the backside metal contact wrapping around a top portion of the at least one source/drain region, a tip of the top portion of the plurality of source/drain regions pointing towards the backside power rail, a top portion of the at least one source/drain region being in electric contact with the backside metal contact, and forming a first epitaxial layer in contact with a top portion of at least another source/drain region adjacent to the at least one source/drain region for electrically isolating the at least another source/drain region from the backside power rail.

BRIEF DESCRIPTION OF THE DRAWINGS

The following detailed description, given by way of example and not intended to limit the invention solely thereto, will best be appreciated in conjunction with the accompanying drawings, in which:

FIG. 7B is a cross-sectional view of the semiconductor structure taken along line Y2-Y2', as shown in FIG. 1, according to an embodiment of the present disclosure;

FIG. 7C is a cross-sectional view of the semiconductor structure taken along line X-X', according to an embodiment of the present disclosure;

FIG. 9B is a cross-sectional view of the semiconductor structure taken along line Y2-Y2', as shown in FIG. 1, according to an embodiment of the present disclosure;

FIG. 9C is a cross-sectional view of the semiconductor structure taken along line X-X', according to an embodiment of the present disclosure;

FIG. 16B is a cross-sectional view of the semiconductor structure taken along line Y2-Y2', as shown in FIG. 1, according to an embodiment of the present disclosure;

FIG. 16C is a cross-sectional view of the semiconductor structure taken along line X-X', according to an embodiment of the present disclosure;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
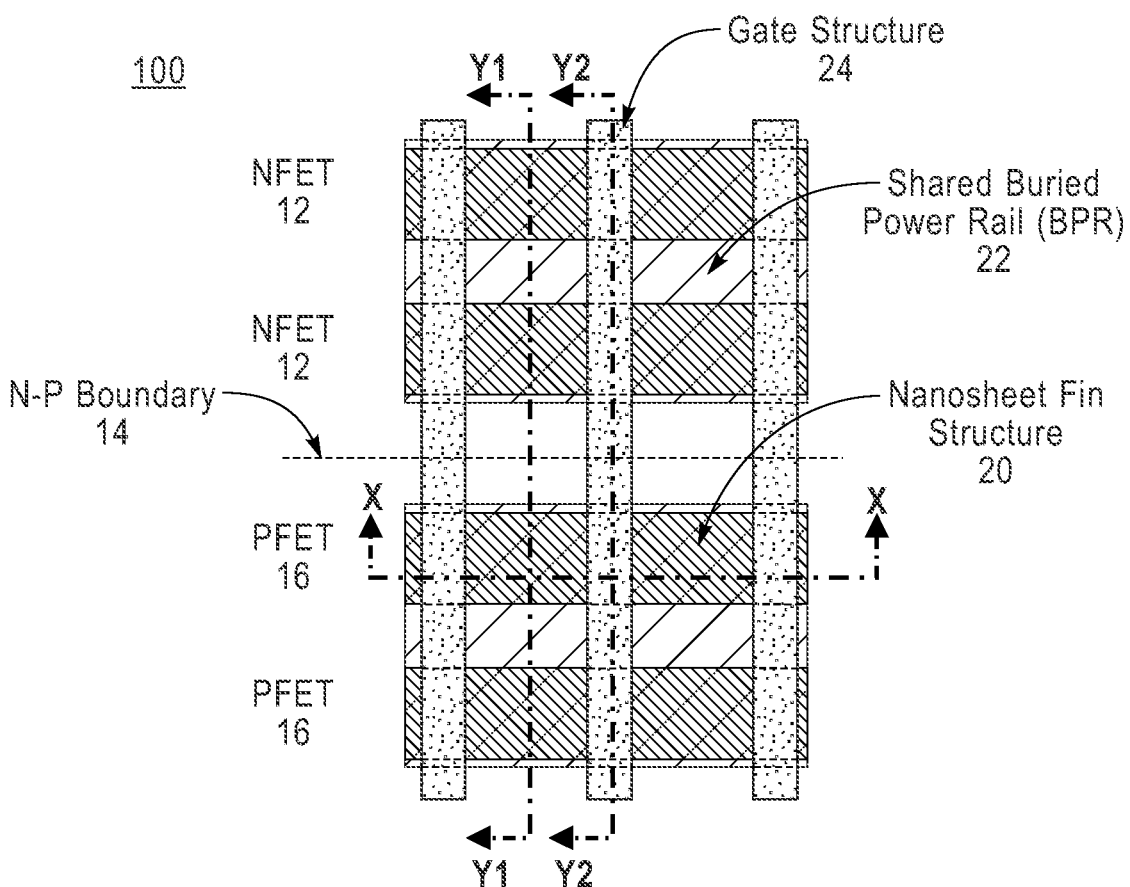
FIG. 1 is a top-down view of a semiconductor structure at an intermediate step during a semiconductor manufacturing process depicting different cross-sectional views used to describe embodiments of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

Embodiments of the present disclosure provide a semiconductor structure, and a method of making the same, in which backside metal contacts having an increased contact area with source/drain regions are formed for connecting to power rails located on a backside of the wafer. The backside metal contacts and backside power rails are formed by backside processes which are performed after completing BEOL processes and flipping the wafer over. When forming the backside metal contacts the semiconductor material on the backside of the device is removed to expose source/drain regions so that the backside metal contacts can be formed and dielectric materials can be filled around the backside metal contacts. In the proposed embodiments a top surface of the source/drain region(s) connected to a backside metal contact has an inverted V-shape or tip-like profile that increases the contact area with the backside metal contact, thereby reducing device resistance and improving performance and reliability.

An embodiment by which the semiconductor structure having a backside metal contact with increased contact area can be formed is described in detailed below by referring to the accompanying drawings in FIGS. 1-17C.

Referring now to FIG. 1, a top-down view of a semiconductor structure 100 is shown at an intermediate step during a semiconductor manufacturing process, according to an embodiment of the present disclosure. Particularly, FIG. 1 depicts different cross-sectional views of the semiconductor structure 100 that will be used to describe embodiments of the present disclosure. The cross-sectional views are taken along line X-X', line Y1-Y1' and line Y2-Y2'. As depicted in the figure, line X-X' represents a cut along a nanosheet fin structure or nanosheet fin region 20 of the semiconductor structure 100, line Y1-Y1' represents a cut across source/drain regions in NFET regions 12 and PFET regions 16 of the semiconductor structure 100, and line Y2-Y2' represents a cut along a gate structure or gate region 24 of the semiconductor structure 100.

In this embodiment, the cross-sectional view taken along line Y1-Y1' may further include a view of NFET regions 12 and/or PFET regions 16 and an area (N-P boundary) 14 between NFET and PFET regions 12, 16. Further, the cross-sectional view taken along line Y1-Y1' includes a view of a shared buried power rail (BPR) region 22.

Figure 2:
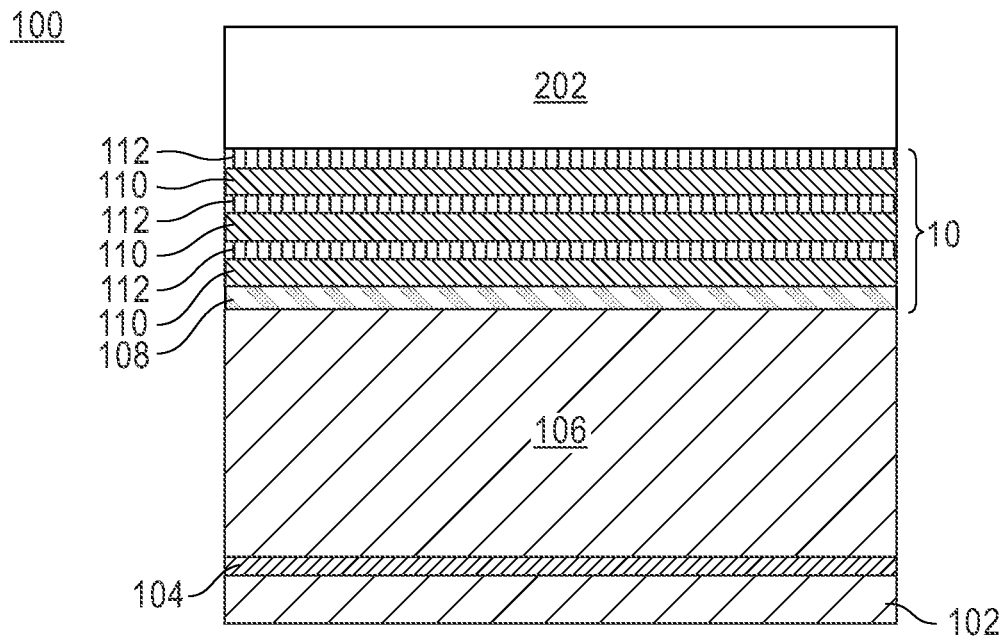
FIG. 2 is a cross-sectional view of the semiconductor structure taken along Y1-Y1', as shown in FIG. 1, depicting forming a nanosheet stack, according to an embodiment of the present disclosure.

Referring now to FIG. 2, a cross-sectional view of the semiconductor structure 100 is shown after forming a nanosheet stack 10, according to an embodiment of the present disclosure. In this embodiment, FIG. 2 is a cross-sectional view of the semiconductor structure 100 taken along Y1-Y1' as depicted in FIG. 1.

In the depicted example, the semiconductor structure 100 includes a substrate 102, a first sacrificial layer 104 located above the substrate 102, and a first semiconductor layer 106 disposed above the first sacrificial layer 104. According to an embodiment, the first sacrificial layer 104 and the first semiconductor layer 106 are vertically stacked one on top of another in a direction perpendicular to the substrate 102, as illustrated in the figure.

The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium phosphide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

With continued reference to FIG. 2, according to an embodiment, the first sacrificial layer 104, can be formed on the substrate 102 using an epitaxial growth process. For instance, in the described embodiment, the first sacrificial layer 104 is formed by epitaxially growing a layer of SiGe with a germanium concentration varying from approximately 15 atomic percent to approximately 35 atomic percent. In a preferred embodiment, the first sacrificial layer 104 is made of epitaxially grown SiGe with a germanium concentration of approximately 30 atomic percent. In one or more embodiments, the first sacrificial layer 104 may act as an etch stop layer during subsequent substrate removal. Similarly, the first semiconductor layer 106 is formed by epitaxially growing a Si layer to a thickness varying from approximately 30 nm to approximately 150 nm, although other thicknesses are within the contemplated scope of the invention. In some embodiments, the first sacrificial layer 104 may include $SiO_2$. In such embodiments, the combined structure formed by the substrate 102, the first sacrificial layer 104, and the first semiconductor layer 106 can be an SOI wafer, with the first sacrificial layer 104 being the buried oxide (BOX) including a thickness ranging from approximately 20 nm to approximately 100 nm, and ranges therebetween.

In general, the first sacrificial layer 104 and the first semiconductor layer 106 can be formed by epitaxial growth by using the substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a 11001 crystal surface will take on a 11001 orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the first sacrificial layer 104 and the first semiconductor layer 106. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

In the depicted embodiment, an alternating sequence of layers of sacrificial semiconductor material and layers of semiconductor channel material vertically stacked one on top of another in a direction perpendicular to the substrate 102 forms the nanosheet stack 10, as illustrated in the figure. Specifically, the alternating sequence includes a nanosheet stack sacrificial layer 108 above the first semiconductor layer 106, a second sacrificial semiconductor layer 110 above the nanosheet stack sacrificial layer 108, and a semiconductor channel layer 112 above the second sacrificial semiconductor layer 110. In the example depicted in the figure, alternating second sacrificial semiconductor layers 110 and semiconductor channel layers 112 are formed in a (nanosheet) stack 10 above the nanosheet stack sacrificial layer 108. The term sacrificial, as used herein, means a layer or other structure, that is (or a part thereof is) removed before completion of the final device.

For instance, in the example being described, portions of the second sacrificial semiconductor layers 110 will be removed from the stack in the channel region of the device to permit the semiconductor channel layers 112 to be released from the nanosheet stack 10. It is notable that while in the present example the second sacrificial semiconductor layers 110 and the semiconductor channel layers 112 are made of silicon germanium (SiGe) and silicon (Si), respectively, any combination of sacrificial and channel materials may be employed in accordance with the present techniques. For example, one might instead employ selective etching technology which permits Si to be used as the sacrificial material between SiGe channel layers.

With continued reference to FIG. 2, a first (sacrificial) layer in the stack, i.e., the nanosheet stack sacrificial layer 108, is formed on the first semiconductor layer 106 using an epitaxial growth process. For instance, in the described embodiment, the nanosheet stack sacrificial layer 108 is formed by epitaxially growing a layer of SiGe with a higher germanium concentration varying between approximately 45 atomic percent to approximately 70 atomic percent. In a preferred embodiment, the nanosheet stack sacrificial layer 108 includes a layer of SiGe with a germanium concentration of approximately 55 atomic percent. The higher concentration of germanium atoms allows the nanosheet stack sacrificial layer 108 to be removed selectively to the remaining alternating layers of the nanosheet stack 10, as will be described in detail below. By way of example only, the nanosheet stack sacrificial layer 108 may be formed having a thickness varying from approximately 5 nm to approximately 20 nm, although thicknesses greater than 20 nm and less than 5 nm may also be used.

In general, layers in the nanosheet stack 10 (e.g., SiGe and Si layers) can be formed by epitaxial growth by using the first semiconductor layer 106 as the seed layer. For instance, the second sacrificial semiconductor layers 110 are formed by epitaxially growing a layer of SiGe. In this embodiment, the germanium concentration of the second sacrificial semiconductor layers 110 may vary from approximately 15 atomic percent to approximately 35 atomic percent. In a preferred embodiment, each of the second sacrificial semiconductor layers 110 includes a layer of SiGe with a germanium concentration of approximately 30 atomic percent.

To continue building the nanosheet stack 10, the semiconductor channel layers 112 are formed by epitaxially growing a Si layer. As depicted in the figure, the second sacrificial semiconductor layers 110 and the semiconductor channel layers 112 have a substantially similar or identical thickness. The nanosheet stack 10 is grown by forming (SiGe) sacrificial semiconductor layers 110 and (Si) semiconductor channel layers 112 in an alternating manner onto the nanosheet stack sacrificial layer 108. Accordingly, each of the second sacrificial semiconductor layers 110 and the semiconductor channel layers 112 in the nanosheet stack 10 can be formed in the same manner as described above, e.g., using an epitaxial growth process, to a thickness varying from approximately 6 nm to approximately 12 nm, although other thicknesses are within the contemplated scope of the invention.

Thus, each of the layers in the nanosheet stack 10 have nanoscale dimensions, and thus can also be referred to as nanosheets. Further, as highlighted above, the (Si) semiconductor channel layers 112 in the nanosheet stack 10 will be used to form the channel layers of the device. Consequently, the dimensions of the semiconductor channel layers 112 dictate the dimensions of the channel region of the semiconductor structure 100.

As highlighted above, the goal is to produce a stack of alternating (sacrificial and channel) SiGe and Si layers on the wafer. The number of layers in the stack can be tailored depending on the particular application. Thus, the configurations depicted and described herein are merely examples meant to illustrate the present techniques. For instance, the present nanosheet stack 10 can contain more or fewer layers than are shown in the figures.

The nanosheet stack 10 can be used to produce a gate all around device that includes vertically stacked semiconductor channel material nanosheets for a positive channel Field Effect Transistor (hereinafter "PFET") or a negative channel Field Effect Transistor (hereinafter "NFET") device.

In the depicted embodiment, the semiconductor structure 100 further includes a hardmask layer 202 formed over the nanosheet stack 10 by depositing a hard mask material (e.g., silicon nitride) using, for example, chemical vapor deposition (CVD), plasma enhanced CVD (PECVD) or any suitable technique for dielectric deposition. By way of example only, the hardmask layer 202 may be formed having a thickness varying from approximately 20 nm to approximately 200 nm, although thicknesses greater than 200 nm and less than 20 nm may also be used.

Figure 3:
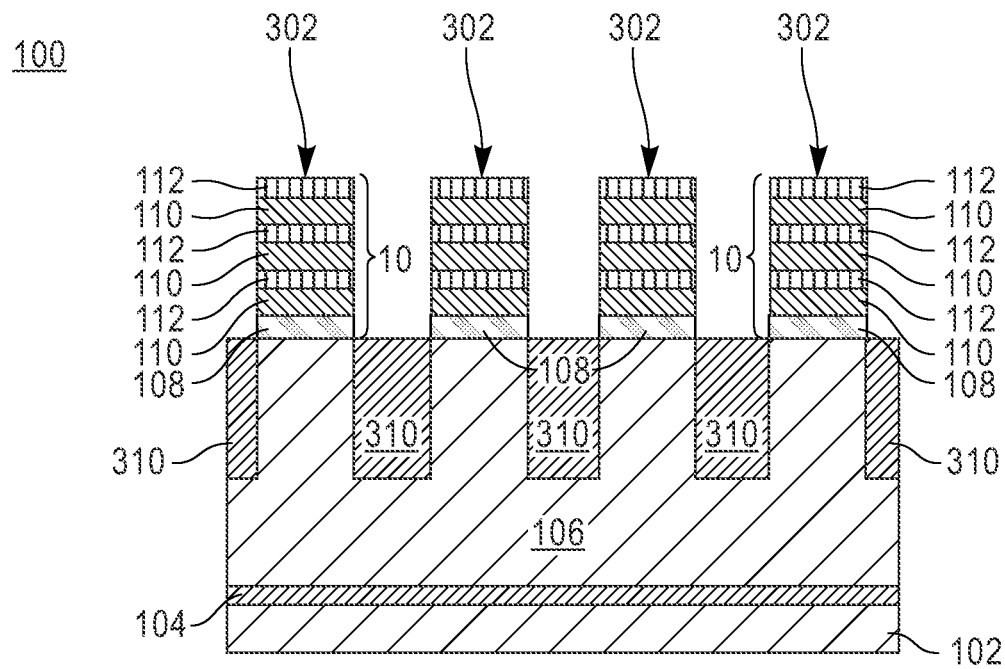
FIG. 3 is a cross-sectional view of the semiconductor structure taken along line Y1-Y1', as shown in FIG. 1, depicting patterning the nanosheet stack, according to an embodiment of the present disclosure.

Referring now to FIG. 3, a cross-sectional view of the semiconductor structure 100 is shown after patterning the nanosheet stack 10 to form a plurality of nanosheet fins (hereinafter "nanosheet fins"), according to an embodiment of the present disclosure. In this embodiment, FIG. 3 is a cross-sectional view of the semiconductor structure 100 taken along Y1-Y1' as depicted in FIG. 1.

After depositing the hardmask layer 202 depicted in FIG. 2, a photolithographic patterning is then conducted on the deposited hardmask layer 202 to form a plurality of individual fin hardmasks. According to an exemplary embodiment, reactive ion etching (RIE) can be used to etch through the nanosheet stack 10 to form nanosheet fins 302. The etching process may continue until upper portions of the first semiconductor layer 106 located between adjacent nanosheet fins 302 are removed forming a plurality of trenches (not shown). The plurality of trenches (not shown) formed during the photolithographic patterning process are subsequently filled with an insulating material to form shallow trench isolation (STI) regions 310, as depicted in the figure.

The process of forming the STI regions 310 is standard and well-known in the art, it typically involves depositing the insulating material to substantially fill the plurality of trenches (not shown) created after removing the portions of the first semiconductor layer 106 located between adjacent nanosheet fins 302. According to an embodiment. the STI regions 310 electrically isolate the nanosheet fins 302. The STI regions 310 may be formed by, for example, CVD of a dielectric material. Non-limiting examples of dielectric materials to form the STI regions 310 include silicon oxide, silicon nitride, hydrogenated silicon carbon oxide, silicon based low-k dielectrics, flowable oxides, porous dielectrics, or organic dielectrics including porous organic dielectrics. After forming the STI regions 310, the hardmask layer 202 (FIG. 2) can be removed from the semiconductor structure 100 using any suitable etching technique.

Figure 4A:
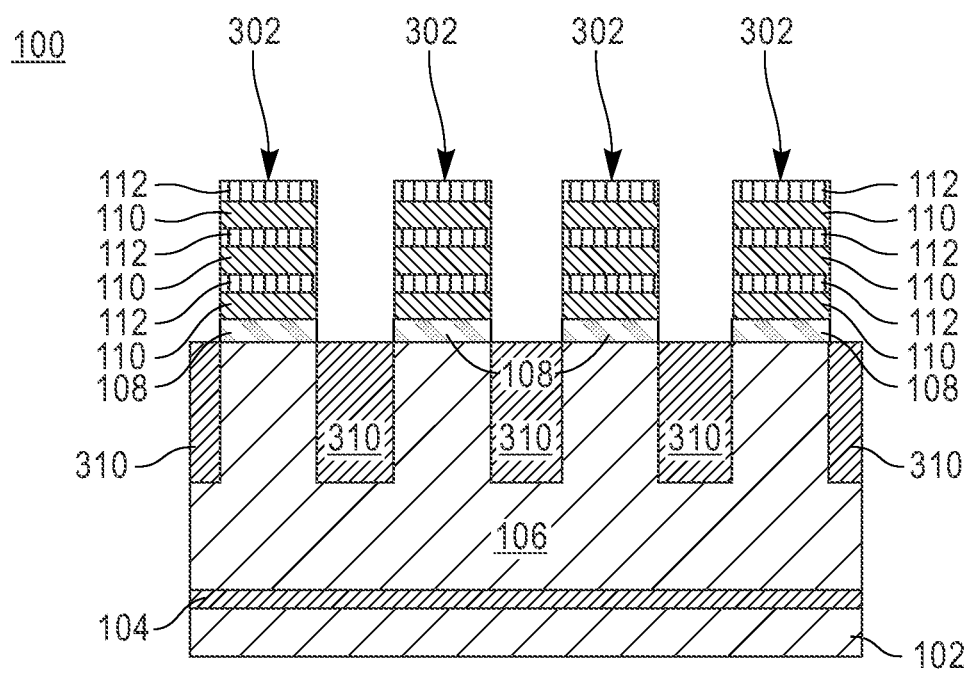
FIG. 4A is a cross-sectional view of the semiconductor structure taken along Y1-Y1', as shown in FIG. 1, depicting depositing a sacrificial hardmask and a dummy gate, according to an embodiment of the present disclosure.
Figure 4C:
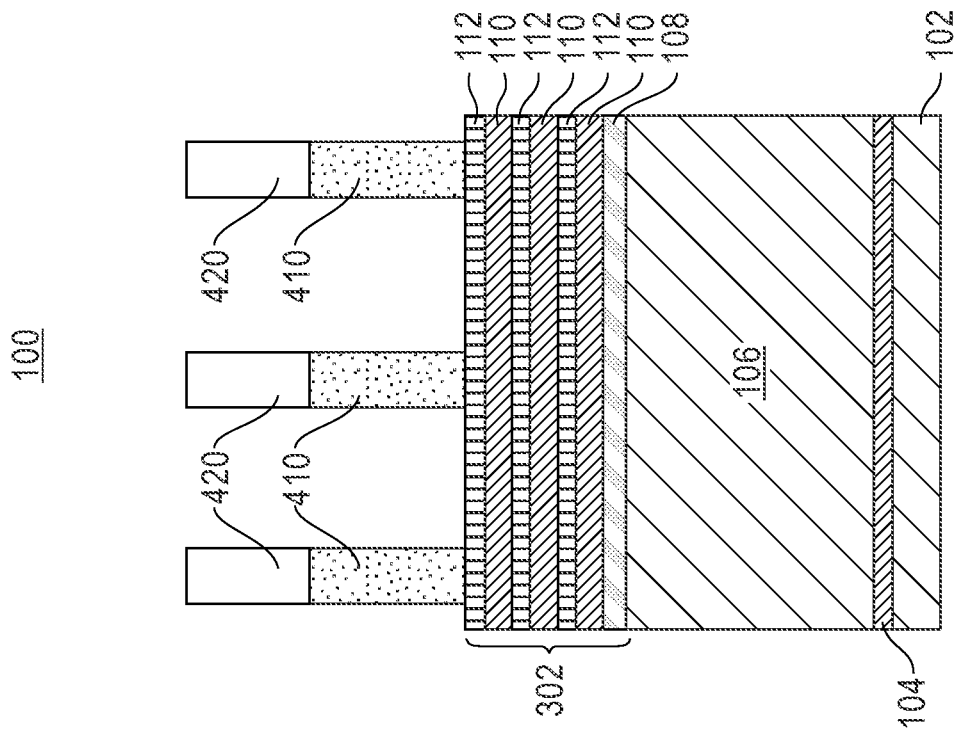
FIG. 4C is a cross-sectional view of the semiconductor structure taken along line X-X', according to an embodiment of the present disclosure.
Figure 4B:
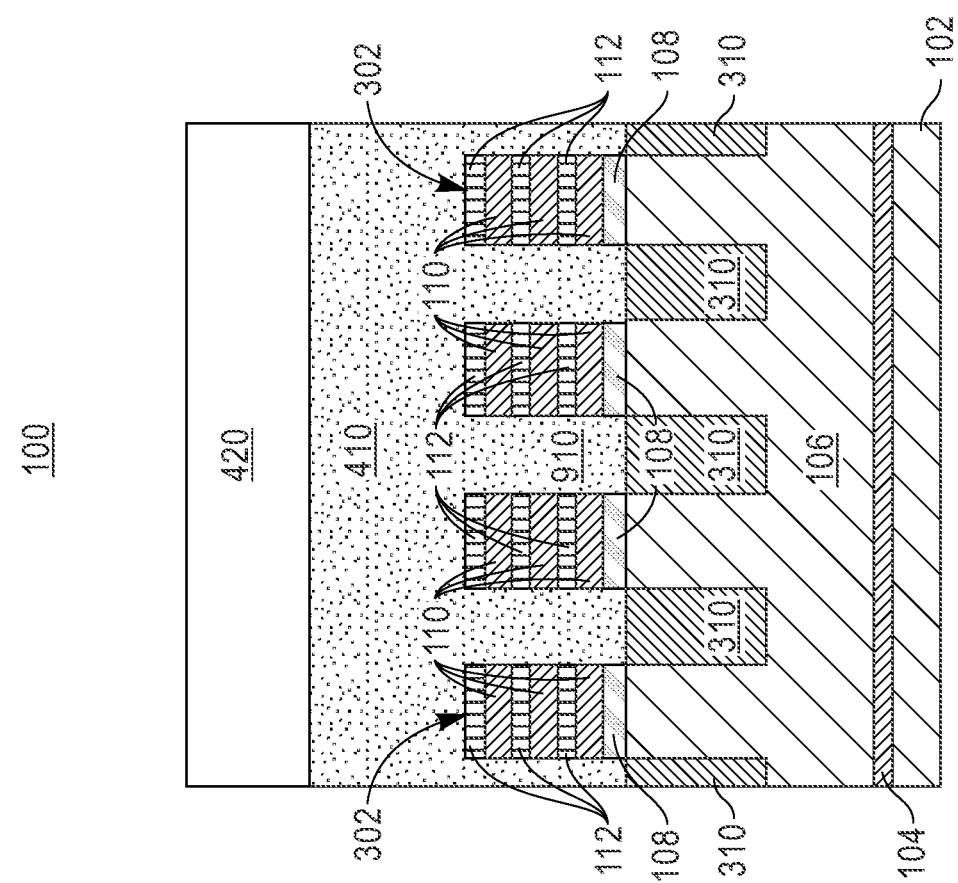
FIG. 4B is a cross-sectional view of the semiconductor structure taken along line Y2-Y2', as shown in FIG. 1, according to an embodiment of the present disclosure.

Referring now to FIGS. 4A-4C, cross-sectional views of the semiconductor structure 100 are shown after depositing a dummy gate 410 and a sacrificial hardmask 420, according to an embodiment of the present disclosure. In this embodiment, FIG. 4A is a cross-sectional view of the semiconductor structure 100 taken along line Y1-Y1', as depicted in FIG. 1; FIG. 4B is a cross-sectional view of the semiconductor structure 100 taken along line Y2-Y2', as depicted in FIG. 1; and FIG. 4C is a cross-sectional view of the semiconductor structure 100 taken along line X-X', as depicted in FIG. 1.

The dummy gate 410 and sacrificial hardmask 420 form a sacrificial gate structure for the semiconductor structure 100. The process of forming the dummy gate 410 and sacrificial hardmask 420 is typical and well-known in the art. In one or more embodiments, the dummy gate 410 is formed from amorphous silicon (a-Si), and the sacrificial hardmask 420 is formed from silicon nitride (SiN), silicon oxide, an oxide/nitride stack, or similar materials and configurations.

After depositing the dummy gate 410 and sacrificial hardmask 420 on the semiconductor structure 100, the dummy gate 410 and sacrificial hardmask 420 are patterned as depicted in the figures. As known by those skilled in the art, the process of patterning the dummy gate 410 typically involves exposing a pattern on a photoresist layer (not shown) and transferring the pattern to the sacrificial hardmask 420 and dummy gate 410 using known lithography and RIE processing, as shown in FIG. 4C. The dummy gate 410 is formed and patterned over a topmost semiconductor channel layer 112 and along sidewalls of the nanosheet fins 302. As depicted in FIG. 4C, patterning of the dummy gate 410 exposes portions of the topmost semiconductor channel layer 112 located between sacrificial gate structures. As mentioned above, the cross-sectional view of FIG. 4A is taken along line Y1-Y1' as depicted in FIG. 1, thus FIG. 4A does not show the sacrificial gate structure formed by the dummy gate 410 and sacrificial hardmask 420.

Figure 5A:
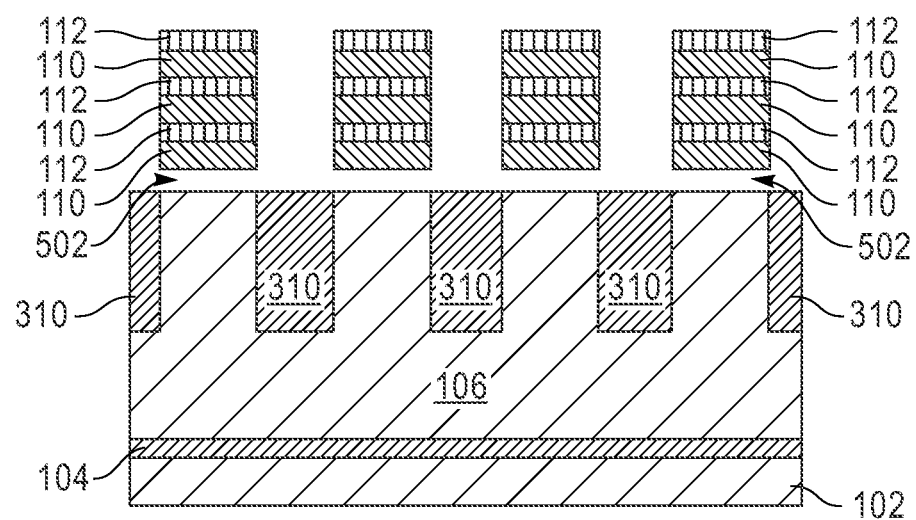
FIG. 5A is a cross-sectional view of the semiconductor structure taken along Y1-Y1', as shown in FIG. 1, depicting removing a nanosheet stack sacrificial layer, according to an embodiment of the present disclosure.
Figure 5C:
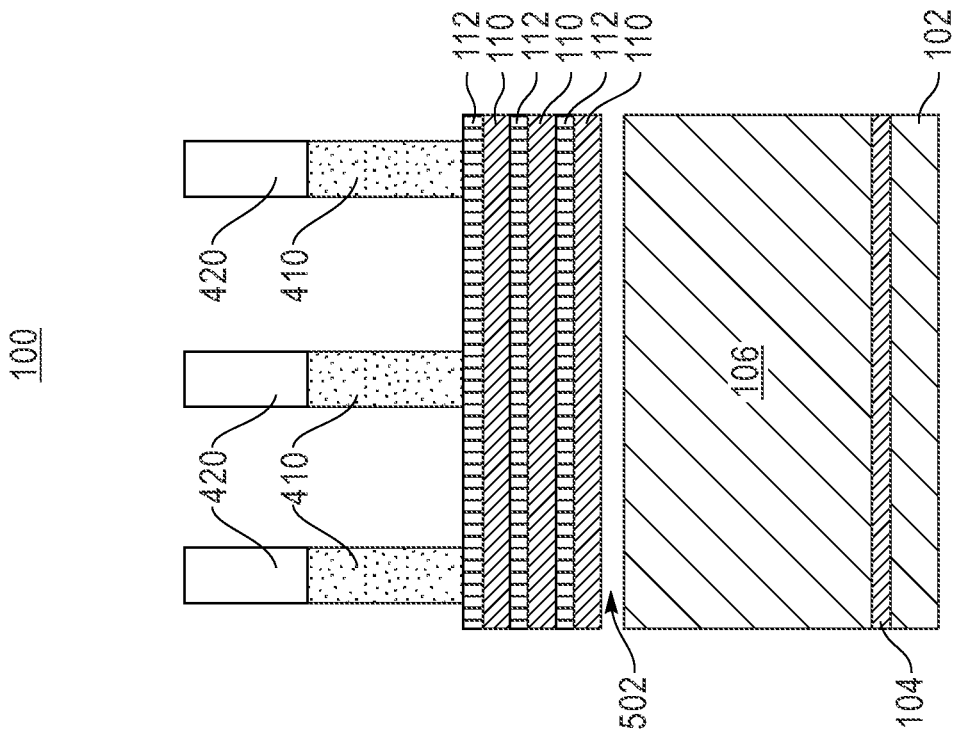
FIG. 5C is a cross-sectional view of the semiconductor structure taken along line X-X', according to an embodiment of the present disclosure.
Figure 5B:
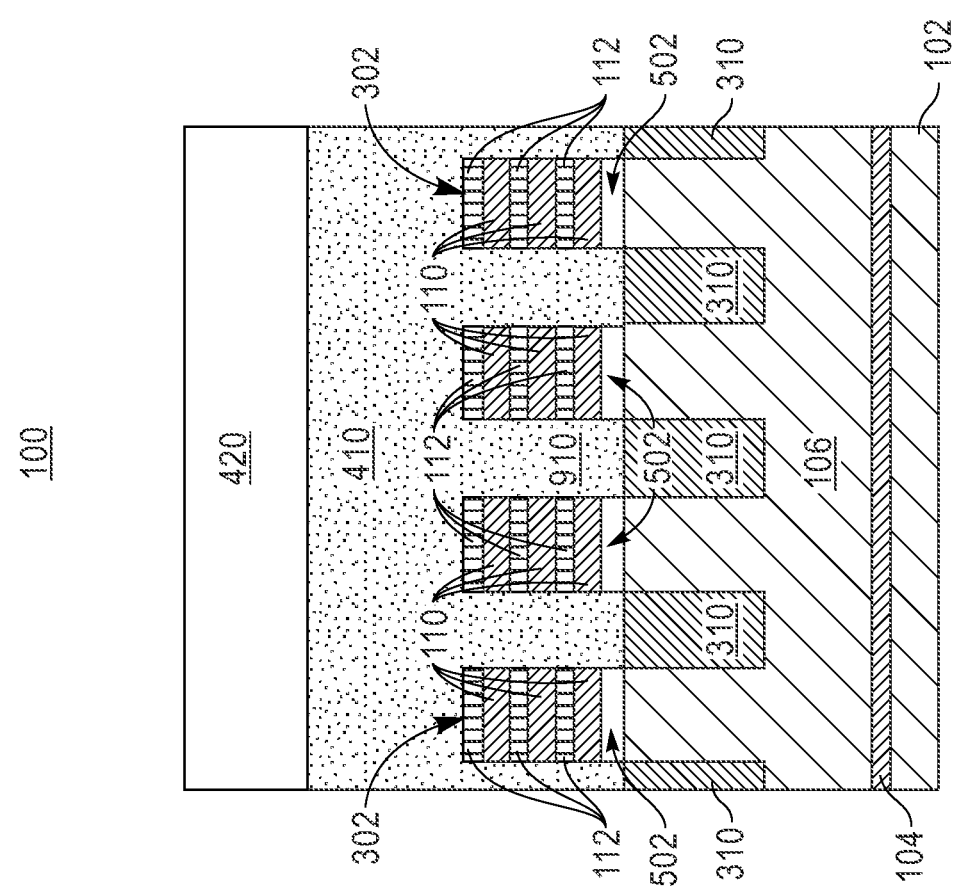
FIG. 5B is a cross-sectional view of the semiconductor structure taken along line Y2-Y2', as shown in FIG. 1, according to an embodiment of the present disclosure.

Referring now to FIGS. 5A-5C, cross-sectional views of the semiconductor structure 100 are shown after removing the nanosheet stack sacrificial layer 108 (FIGS. 4A-4C), according to an embodiment of the present disclosure. In this embodiment, FIG. 5A is a cross-sectional view of the semiconductor structure 100 taken along line Y1-Y1', as depicted in FIG. 1; FIG. 5B is a cross-sectional view of the semiconductor structure 100 taken along line Y2-Y2', as depicted in FIG. 1; and FIG. 5C is a cross-sectional view of the semiconductor structure 100 taken along line X-X', as depicted in FIG. 1.

As shown in the depicted embodiment, removal of the nanosheet stack sacrificial layer 108 (FIGS. 4A-4C) creates first openings 502 in areas of the semiconductor structure 100 from which the nanosheet stack sacrificial layer 108 (FIGS. 4A-4C) was removed. According to an embodiment, the nanosheet stack sacrificial layer 108 is removed selective to the first semiconductor layer 106, the second sacrificial semiconductor layers 110, the semiconductor channel layers 112, the dummy gate 410 and the sacrificial hardmask 420. For example, a highly selective dry etch process can be used to selectively remove the nanosheet stack sacrificial layer 108 (FIGS. 4A-4C).

Figure 6A:
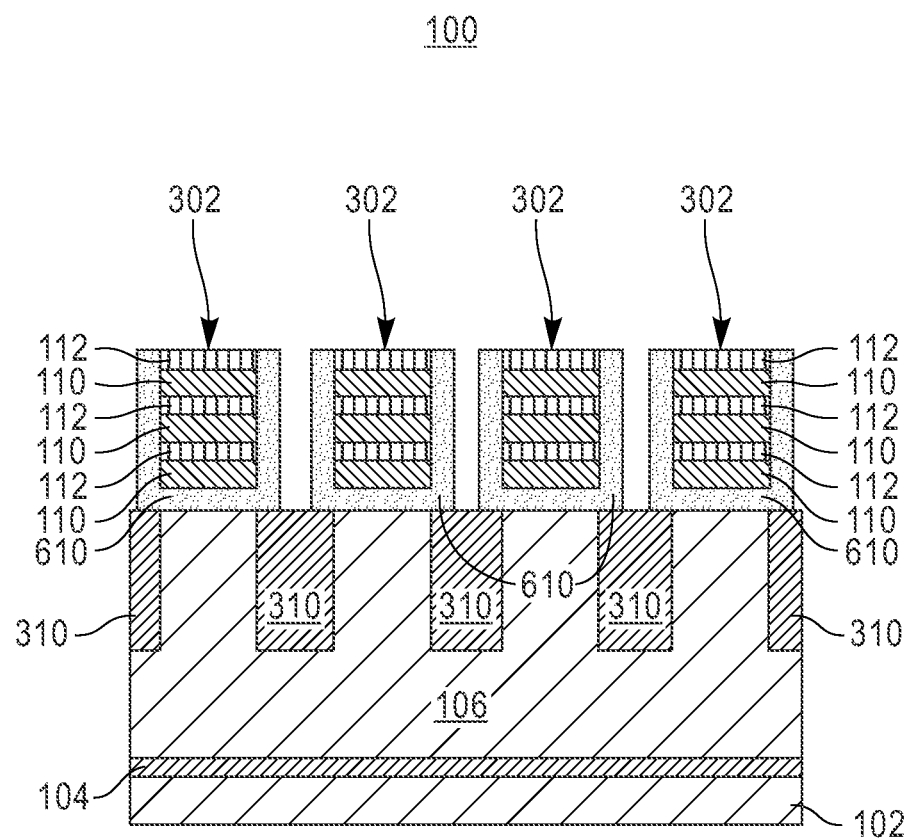
FIG. 6A is a cross-sectional view of the semiconductor structure taken along Y1-Y1', as shown in FIG. 1, depicting forming a sidewall spacer, according to an embodiment of the present disclosure.
Figure 6C:
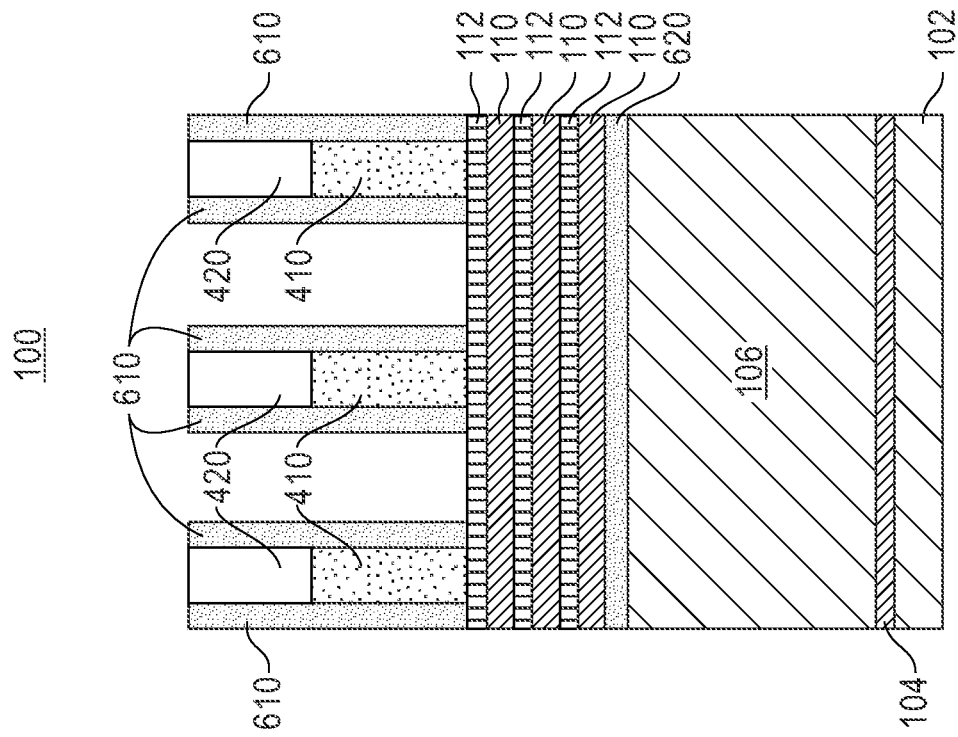
FIG. 6C is a cross-sectional view of the semiconductor structure taken along line X-X', according to an embodiment of the present disclosure.
Figure 6B:
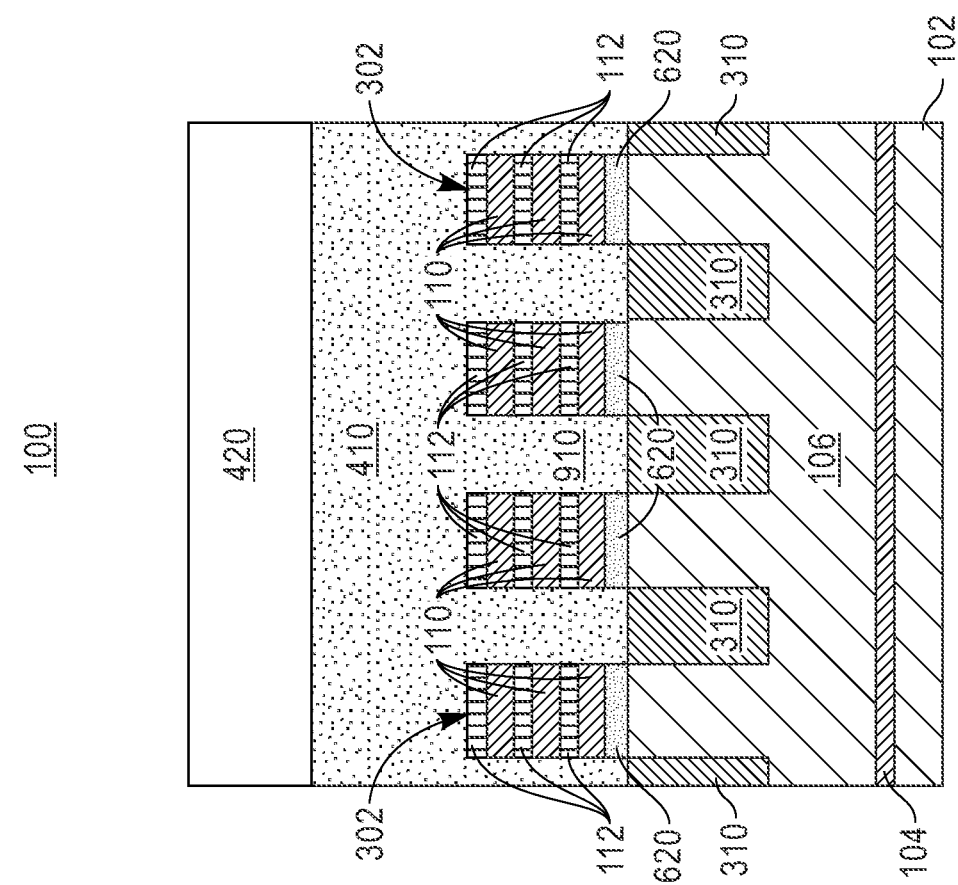
FIG. 6B is a cross-sectional view of the semiconductor structure taken along line Y2-Y2', as shown in FIG. 1, according to an embodiment of the present disclosure.

Referring now to FIGS. 6A-6C, cross-sectional views of the semiconductor structure 100 are shown after forming a sidewall spacer 610, according to an embodiment of the present disclosure. In this embodiment, FIG. 6A is a cross-sectional view of the semiconductor structure 100 taken along line Y1-Y1', as depicted in FIG. 1; FIG. 6B is a cross-sectional view of the semiconductor structure 100 taken along line Y2-Y2', as depicted in FIG. 1; and FIG. 6C is a cross-sectional view of the semiconductor structure 100 taken along line X-X', as depicted in FIG. 1.

In this embodiment, a spacer material is deposited on the semiconductor structure 100. As depicted in FIG. 6C, the spacer material deposits along sidewalls of the dummy gate 410 and sacrificial hardmask 420 to form the sidewall spacer 610. The spacer material forming the sidewall spacer 610 substantially fills the first openings 502 shown in FIGS. 5A-5C. The sidewall spacer 610 can be formed using a spacer pull down formation process. The sidewall spacer 610 can also be formed using a sidewall image transfer (SIT) spacer formation process, which includes spacer material deposition followed by directional RIE of the deposited spacer material.

In one or more embodiments, the spacer material deposited between a bottom surface of the nanosheet fins 302 and the substrate 106 can be referred to as a bottom dielectric isolation layer 620. In some embodiments, the bottom dielectric isolation layer 620 and the sidewall spacer 610 may be composed of different materials.

Non-limiting examples of various spacer materials for forming the sidewall spacer 610 and the bottom dielectric isolation layer 620 may include conventional low-k materials such as $SiO_2$, SiOC, SiOCN, or SiBCN. Typically, a thickness of the sidewall spacer 610 may vary from approximately 5 nm to approximately 20 nm, and ranges therebetween.

Figure 7A:
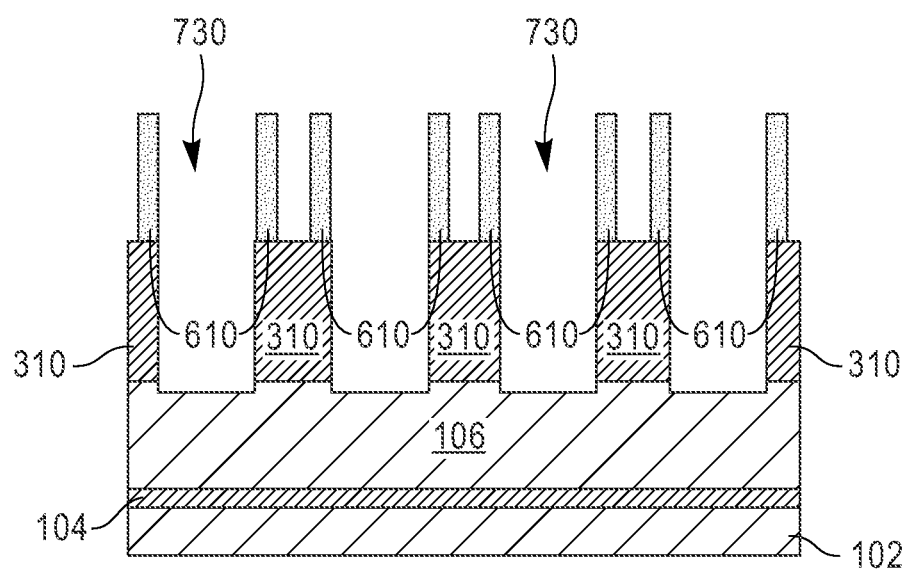
FIG. 7A is a cross-sectional view of the semiconductor structure taken along Y1-Y1', as shown in FIG. 1, depicting recessing nanosheet fins and forming inner spacers, according to an embodiment of the present disclosure.

Referring now to FIGS. 7A-7C, cross-sectional views of the semiconductor structure 100 are shown after recessing nanosheet fins 302 and forming inner spacers 720, according to an embodiment of the present disclosure. In this embodiment, FIG. 7A is a cross-sectional view of the semiconductor structure 100 taken along line Y1-Y1', as depicted in FIG. 1; FIG. 7B is a cross-sectional view of the semiconductor structure 100 taken along line Y2-Y2', as depicted in FIG. 1; and FIG. 7C is a cross-sectional view of the semiconductor structure 100 taken along line X-X', as depicted in FIG. 1.

As known by those skilled in the art, the sidewall spacer 610 can be used as a mask, to recess portions of the nanosheet fins 302 not covered by the sidewall spacer 610 and dummy gate 410, as illustrated in FIG. 7C. For example, a RIE process can be used to recess the portions of the nanosheet fins 302 that are not under the sidewalls spacer 610 and dummy gate 410. According to an embodiment, the nanosheet fins 302 can be recessed until reaching a bottom portion of the STI regions 310. As depicted in FIGS. 7A and 7C, recessing of the first semiconductor layer 106 form second openings (or source/drain recesses) 730.

With continued reference to FIGS. 7A-7C, outer portions of each of the second sacrificial semiconductor layers 110 are selectively recessed using, for example, a selective etch process such as a hydrogen chloride (HCL) gas etch. Preferably, the selected etch process for recessing the second sacrificial semiconductor layers 110 is capable of etching silicon germanium without attacking silicon. The inner spacers 720 may be formed within an indented cavity (not shown) formed after etching the second sacrificial semiconductor layers 110. The inner spacers 720 can be formed, for example, by conformal deposition of an inner spacer dielectric material that pinches off the indented cavity (not shown) formed after recessing the second sacrificial semiconductor layers 110. The inner spacers 720 may be formed using any suitable dielectric material, such as silicon dioxide, silicon nitride, SiOC, SiOCN, SiBCN, and may include a single layer or multiple layers of dielectric materials. An isotropic etch can then be conducted to remove excess inner spacer material from other regions of the semiconductor structure 100.

As depicted in FIG. 7C, outer sidewalls of the inner spacers 720 are vertically aligned with the semiconductor channel layers 112, and thus with upper portions of the sidewall spacer 610 located on opposing sidewalls of the dummy gate 410.

Figure 8A:
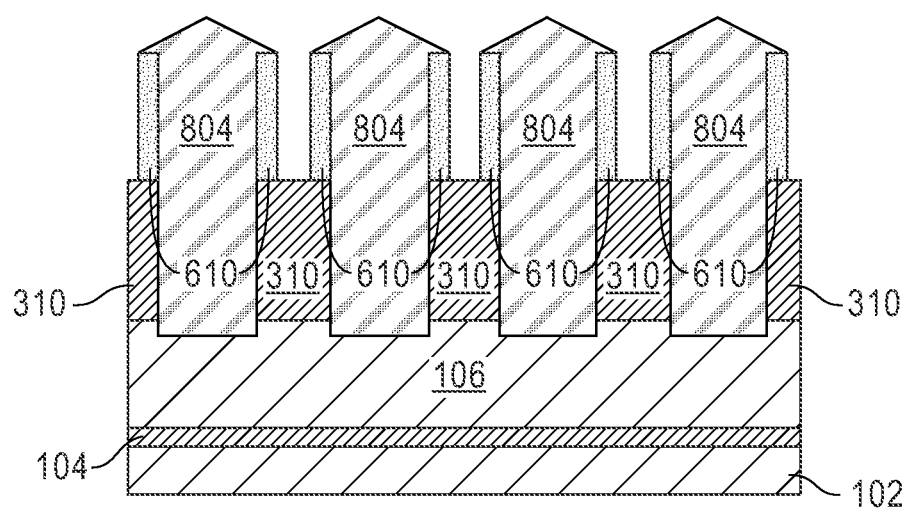
FIG. 8A is a cross-sectional view of the semiconductor structure taken along Y1-Y1', as shown in FIG. 1, depicting forming a first epitaxial layer, according to an embodiment of the present disclosure.
Figure 8C:
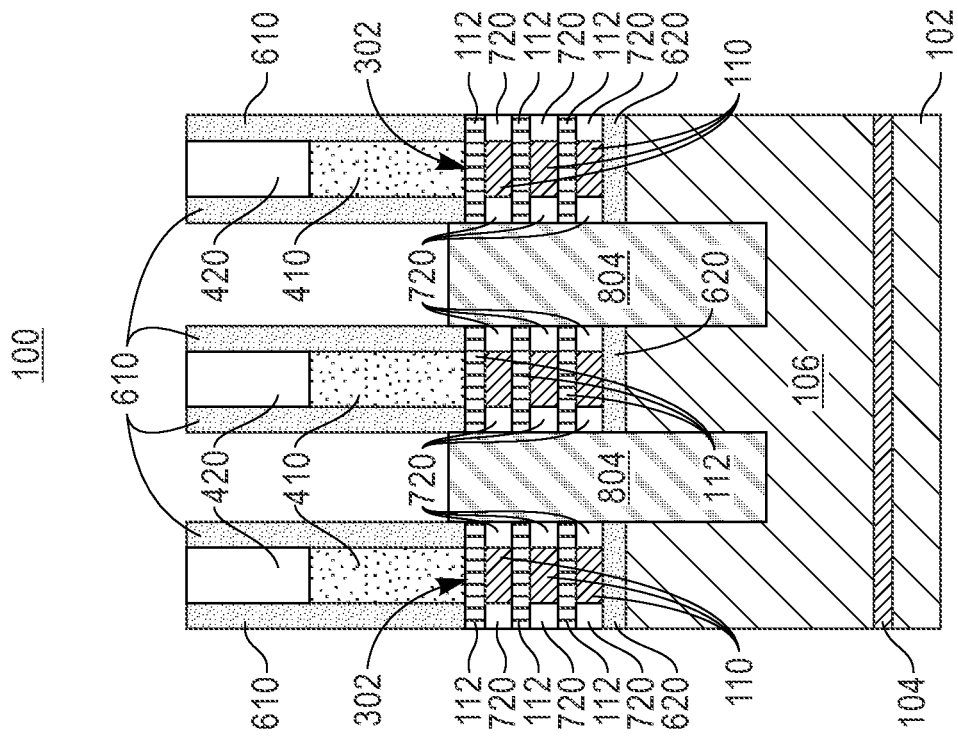
FIG. 8C is a cross-sectional view of the semiconductor structure taken along line X-X', according to an embodiment of the present disclosure.
Figure 8B:
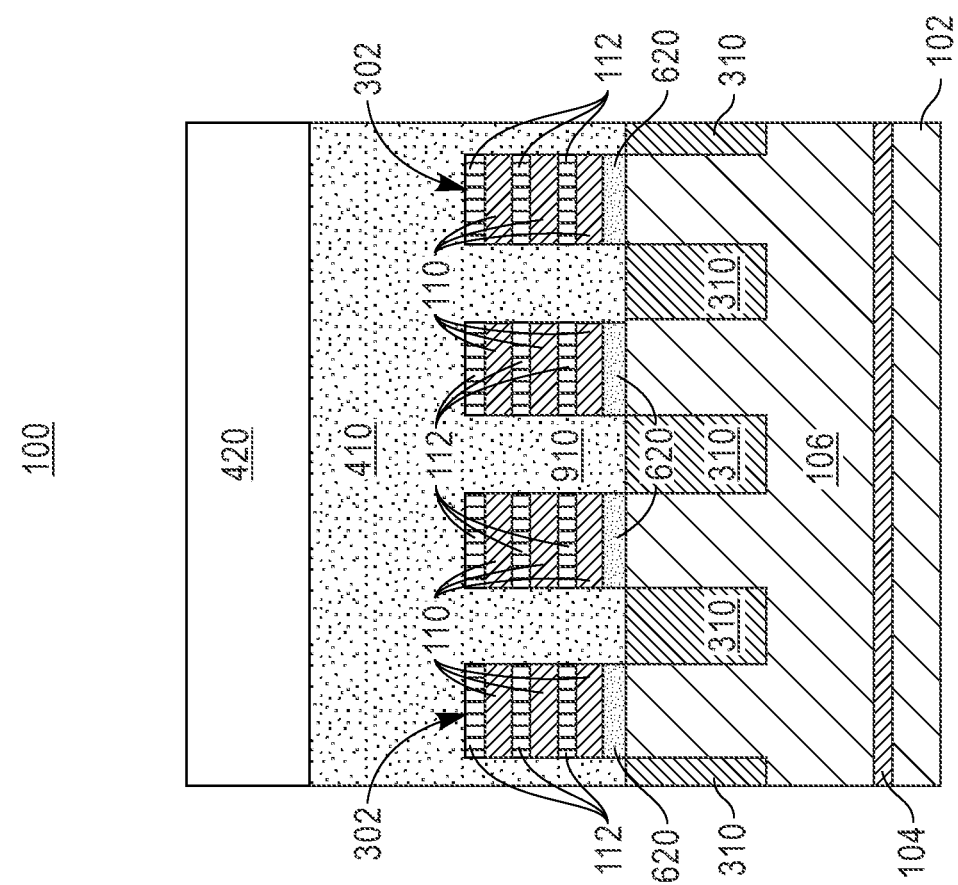
FIG. 8B is a cross-sectional view of the semiconductor structure taken along line Y2-Y2', as shown in FIG. 1, according to an embodiment of the present disclosure.

Referring now to FIGS. 8A-8C, cross-sectional views of the semiconductor structure 100 are shown after forming a first epitaxial layer 804, according to an embodiment of the present disclosure. In this embodiment, FIG. 8A is a cross-sectional view of the semiconductor structure 100 taken along line Y1-Y1', as depicted in FIG. 1; FIG. 8B is a cross-sectional view of the semiconductor structure 100 taken along line Y2-Y2', as depicted in FIG. 1; and FIG. 8C is a cross-sectional view of the semiconductor structure 100 taken along line X-X', as depicted in FIG. 1.

According to an embodiment, the first epitaxial layer 804 can be formed using an epitaxial layer growth process on the exposed ends of the semiconductor channel layers 112. The epitaxial growth process used to form the first epitaxial layer 804 is similar to the process previously described for forming the nanosheet fins 302. As shown in FIGS. 8A and 8C, the first epitaxial layer 804 is epitaxially grown within the second openings 730 (FIGS. 7A-7C). In an exemplary embodiment, the first epitaxial layer 804 may be composed of undoped SiGe.

As depicted in FIG. 8C, the first epitaxial layer 804 is formed on opposing sides of the nanosheet fins 302 in direct contact with end portions of the semiconductor channel layers 112 and end portions of the inner spacers 720 surrounding the second sacrificial semiconductor layers 110. It should be noted that, as may be known by those skilled in the art, the diamond shape observed in the top of the first epitaxial layer 804 depicted in FIG. 8A may be a consequence of the different growth rates during the epitaxial deposition process inherent to each crystallographic orientation plane of the material forming the first epitaxial layer 804. In other embodiments, the first epitaxial layer 804 may have a shape other than the diamond shape depicted in FIG. 8A.

Figure 9A:
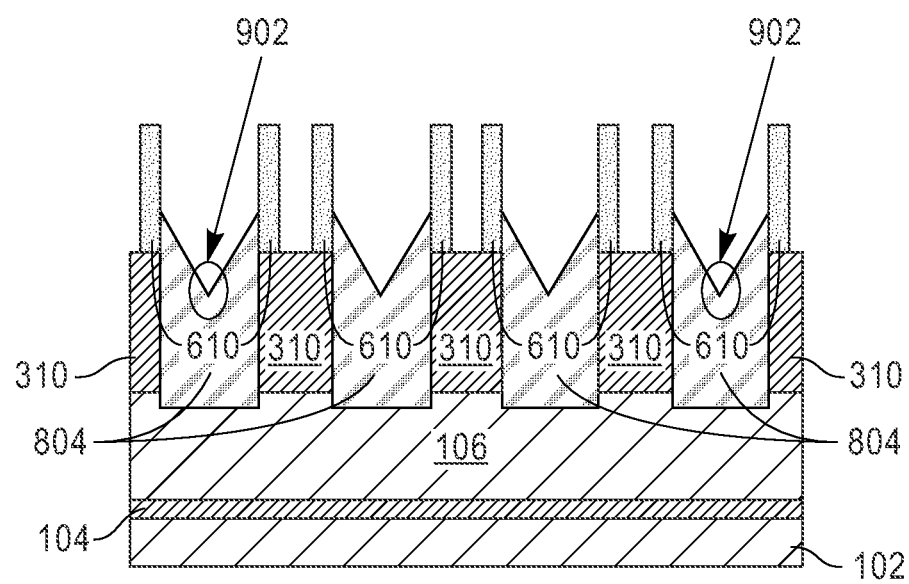
FIG. 9A is a cross-sectional view of the semiconductor structure taken along Y1-Y1', as shown in FIG. 1, depicting recessing the first epitaxial layer, according to an embodiment of the present disclosure.

Referring now to FIGS. 9A-9C, cross-sectional views of the semiconductor structure 100 are shown after recessing the first epitaxial layer 804, according to an embodiment of the present disclosure. In this embodiment, FIG. 9A is a cross-sectional view of the semiconductor structure 100 taken along line Y1-Y1', as depicted in FIG. 1; FIG. 9B is a cross-sectional view of the semiconductor structure 100 taken along line Y2-Y2', as depicted in FIG. 1; and FIG. 9C is a cross-sectional view of the semiconductor structure 100 taken along line X-X', as depicted in FIG. 1.

At this step of the manufacturing process, a dry etch process is performed on the first epitaxial layer 804 to achieve a shape that substantially resembles the letter "V". Stated differently, the first epitaxial layer 804 is etched in a way such that opposing sidewalls of the etched first epitaxial layer 804 are at a taper angle, tapering or narrowing towards a point 902, as depicted in FIGS. 9A and 9C.

Figure 10A:
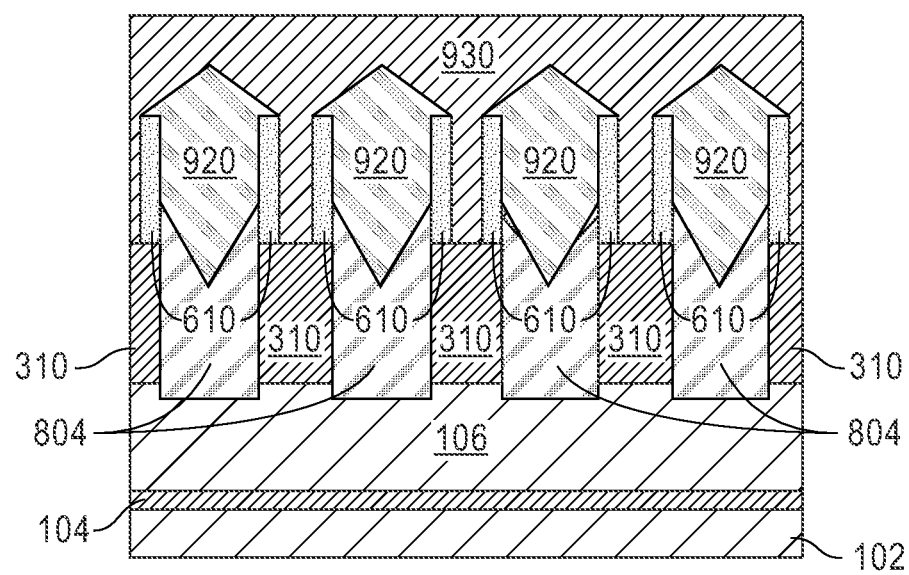
FIG. 10A is a cross-sectional view of the semiconductor structure taken along Y1-Y1', as shown in FIG. 1, depicting completion of front-end-of-line processing steps, according to an embodiment of the present disclosure.
Figure 10C:
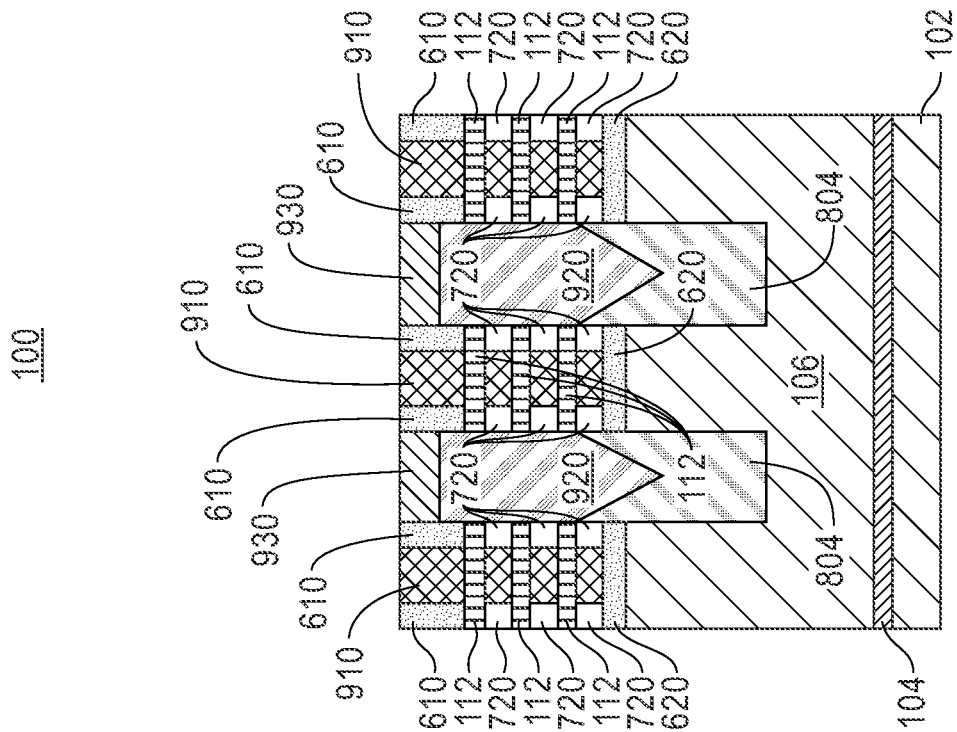
FIG. 10C is a cross-sectional view of the semiconductor structure taken along line X-X', according to an embodiment of the present disclosure.
Figure 10B:
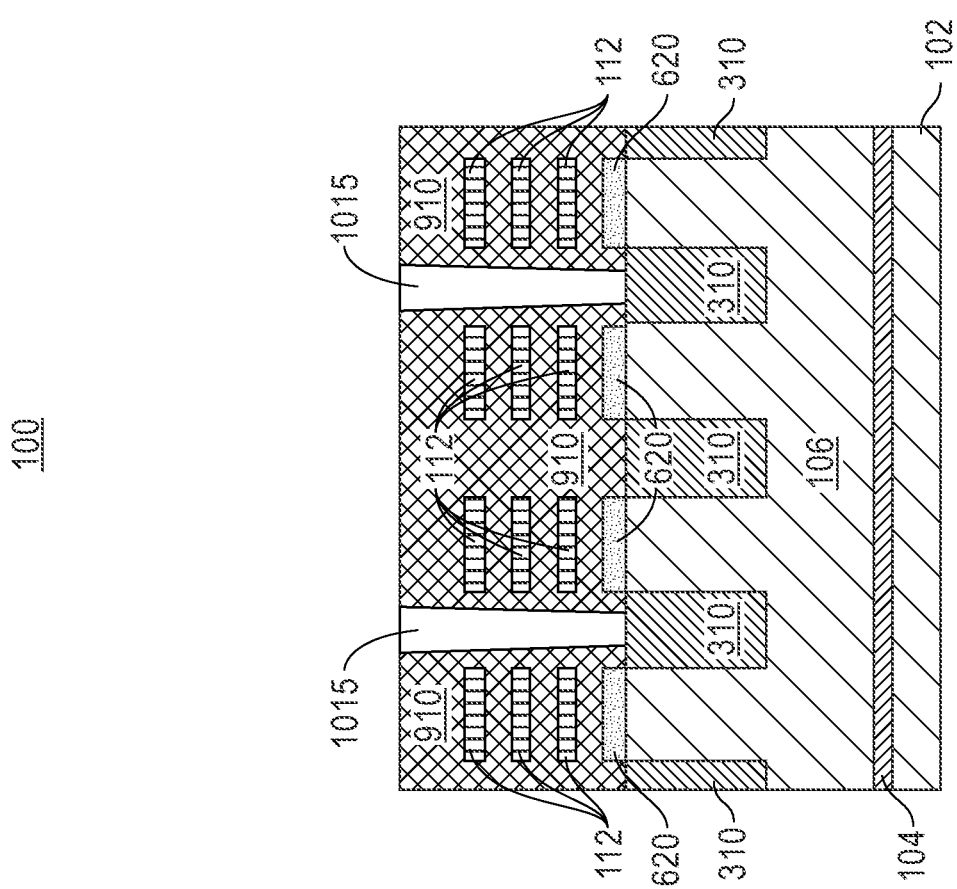
FIG. 10B is a cross-sectional view of the semiconductor structure taken along line Y2-Y2', as shown in FIG. 1, according to an embodiment of the present disclosure.

Referring now to FIGS. 10A-10C, cross-sectional views of the semiconductor structure 100 are shown after completing front-end-of-line (FEOL) processing steps, according to an embodiment of the present disclosure. In this embodiment, FIG. 10A is a cross-sectional view of the semiconductor structure 100 taken along line Y1-Y1', as depicted in FIG. 1; FIG. 10B is a cross-sectional view of the semiconductor structure 100 taken along line Y2-Y2', as depicted in FIG. 1; and FIG. 10C is a cross-sectional view of the semiconductor structure 100 taken along line X-X', as depicted in FIG. 1.

Known semiconductor fabrication operations have been used to form the semiconductor structure 100 as depicted in FIGS. 10A-10C. Thus, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Generally, at this step of the manufacturing process, a replacement gate 910, source/drain regions 920, and an interlevel dielectric (ILD) layer 930 are formed in the semiconductor structure 100. According to an embodiment, after recessing the first epitaxial layer 804, source/drain regions 920 can be formed in the semiconductor structure 100. As known by those skilled in the art, source/drain regions are formed within NFET and PFET regions 12, 16 (shown in FIG. 1) of the semiconductor structure 100 using methods well-known in the art. For example, the source/drain regions 920 can be formed using an epitaxial layer growth process on the exposed ends of the semiconductor channel layers 112.

The source/drain regions 920 can be formed on opposing sides of the nanosheet fins 302 in direct contact with end portions of the semiconductor channel layers 112 and end portions of the inner spacers 720. In an embodiment, the source/drain regions 920 may be formed off the first epitaxial layer 804. Similar to the first epitaxial layer 804, a top portion of the source/drain regions 920 may include a diamond shape consequence of the different growth rates during the epitaxial deposition process inherent to each crystallographic orientation plane of the material forming the source/drain regions 920. In other embodiments, the source/drain regions 920 may have a shape other than the diamond shape depicted in FIG. 10A. Further, as can be observed in FIGS. 10A and 10C, a bottom portion of the source/drain regions 920 (in direct contact with the first epitaxial layer 804) is formed including the V-shape or tip-like profile of the underlying first epitaxial layer 804.

Typically, after forming the source/drain regions 920 the interlevel dielectric layer 930 can be formed to fill voids in the semiconductor structure 100. The interlevel dielectric layer 930 can be formed by, for example, CVD of a dielectric material. Non-limiting examples of dielectric materials to form the interlevel dielectric layer 930 may include silicon oxide, silicon nitride, hydrogenated silicon carbon oxide, silicon based low-k dielectrics, flowable oxides, porous dielectrics, or organic dielectrics including porous organic dielectrics.

As known by those skilled in the art, after deposition of the interlevel dielectric layer 930, a planarization process (e.g., CMP) can be conducted on the semiconductor structure 100. This process may expose a top surface of the dummy gate 410 (FIGS. 9A-9C) in preparation for a replacement metal gate process. In a gate-last fabrication process, the removed dummy gate 410 is thereafter replaced with a high-k metal gate structure, i.e., the replacement gate 910 as known in the art. According to an embodiment, the sacrificial semiconductor layers 110 (FIGS. 9A-9B) can now be removed from the semiconductor structure 100 using known etching processes including, for example, RIE, wet etch or dry gas (HCl). Removal of the sacrificial semiconductor layers 110 (FIGS. 9A-9B) create cavities (not shown) between the inner spacers 720 that will subsequently be filled with corresponding gate dielectric and work function metals to form the high-k metal gate structure or replacement gate 910, as depicted in FIGS. 10B-10C.

The replacement gate 910 includes gate dielectrics, such as hafnium oxide ($HfO_2$), zirconium dioxide ($ZrO_2$), hafnium-aluminum oxide (HfAlOx), hafnium-lanthanum oxide g (HfLaOx), etc., and one or more work function metals including, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). As can be appreciated in FIG. 10B, the replacement gate 910 surrounds (stacked) semiconductor channel layers 112. In one or more embodiments, a gate cap (not shown) may be formed above the replacement gate 910.

After forming the replacement gate 910, a chemical mechanical polishing (CMP) may be conducted to remove excess material and polish upper surfaces of the semiconductor structure 100.

In one or more embodiments, a gate cut process can be conducted on the semiconductor structure 100 for isolating gate structures from different CMOS cells. During the process, a gate cut region 1015 can be formed either before replacement metal gate (RMG) or after RMG, and then filled with dielectrics such as $SiO_2$, SiN, SiBCN, SiOCN, SiOC, SiC, and the like, as depicted in FIG. 10B.

Figure 11A:
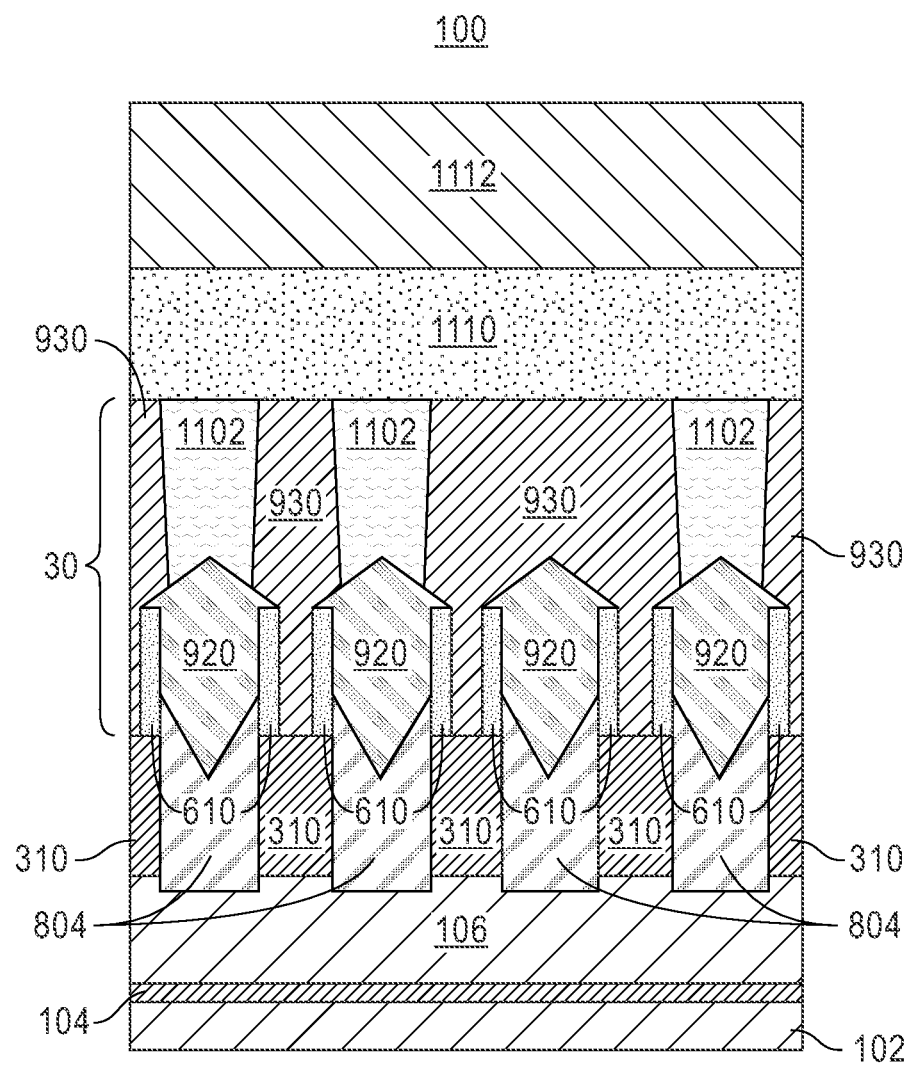
FIG. 11A is a cross-sectional view of the semiconductor structure taken along Y1-Y1', as shown in FIG. 1, depicting middle-of-line contact patterning and metallization, and forming a back-end-of-line interconnect level and a carrier wafer, according to an embodiment of the present disclosure.
Figure 11C:
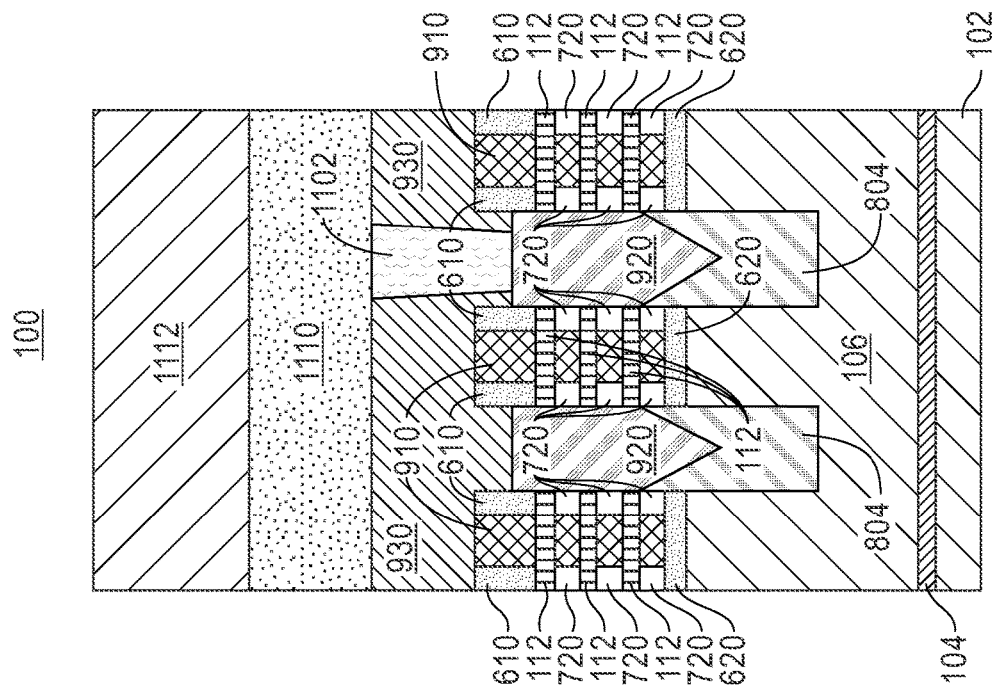
FIG. 11C is a cross-sectional view of the semiconductor structure taken along line X-X', according to an embodiment of the present disclosure.
Figure 11B:
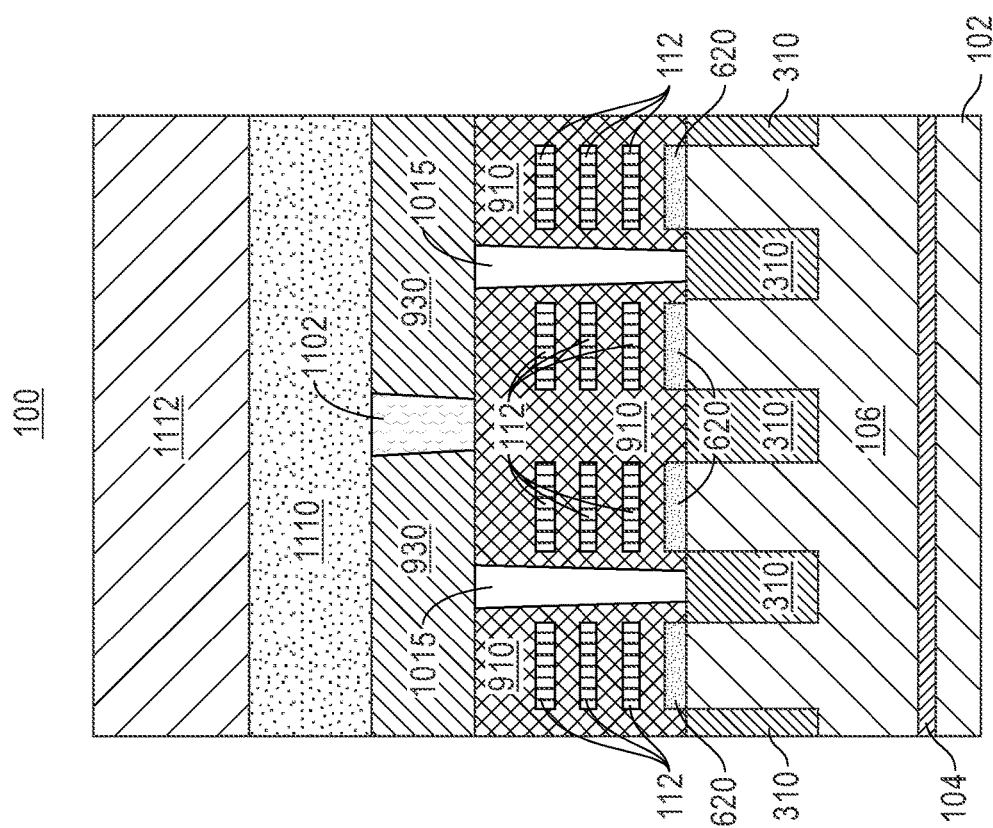
FIG. 11B is a cross-sectional view of the semiconductor structure taken along line Y2-Y2', as shown in FIG. 1, according to an embodiment of the present disclosure.

Referring now to FIGS. 11A-11C, cross-sectional views of the semiconductor structure 100 are shown after middle-of-line (MOL) contact patterning and metallization, and forming a back-end-of-line (BEOL) interconnect level 1110 and a carrier wafer 1112, according to an embodiment of the present disclosure. In this embodiment, FIG. 11A is a cross-sectional view of the semiconductor structure 100 taken along line Y1-Y1', as depicted in FIG. 1; FIG. 11B is a cross-sectional view of the semiconductor structure 100 taken along line Y2-Y2', as depicted in FIG. 1; and FIG. 11C is a cross-sectional view of the semiconductor structure 100 taken along line X-X', as depicted in FIG. 1.

As illustrated in the figure, a plurality of conductive structures including metal contacts 1102 are formed in the semiconductor structure 100 for electrically connecting FEOL devices to subsequently formed metal levels. The process of forming the metal contacts 1002 is standard and well-known in the art. Typically, the process includes forming trenches (not shown) within the interlevel dielectric layer 930 and subsequently filling the trenches with a conductive material or a combination of conductive materials to form the metal contacts 1102. In one or more embodiments, the conductive material filling the metal contacts 1102 may include a silicide liner (e.g., titanium (Ti), nickel (Ni), nickel-platinum (NiPt) alloy, etc.), a metal adhesion liner (e.g., titanium nitride (TiN)), and a conductive metal (e.g., aluminum (Al), tungsten (W), copper (Co), ruthenium (Ru), or any combination thereof).

The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100. Specifically, in the depicted example, metal contacts 1102 may include source/drain contacts (CA) that extend until an uppermost surface of source/drain regions 920, as depicted in FIGS. 11A and 11C, and gate contacts (CB) to the replacement gate 910, as depicted in FIG. 11B.

With continued reference to FIGS. 11A-11C, the BEOL interconnect level 1110 is formed above, and electrically connected to, the FEOL device level 30 of the semiconductor structure 100. Although not depicted in the figures, the BEOL interconnect level 1110 typically includes contacts, insulating layers (dielectrics), metal levels, and bonding sites for chip-to-package connections, as may be known by those skilled in the art. As mentioned above, various steps in the manufacture of semiconductor devices and semiconductor-based ICs are well known and so, in the interest of brevity, many conventional steps will only be mentioned briefly herein or will be omitted entirely without providing the well-known process details.

According to an embodiment, after forming the BEOL interconnect level 1110, the semiconductor structure 100 (i.e., the semiconductor wafer) is bonded to the carrier wafer (or auxiliary substrate) 1112. The carrier wafer 1112 may act as a reinforcing substrate for providing mechanical strength during processing (e g., thinning) of the semiconductor wafer. The process of bonding the semiconductor wafer to the carrier wafer 1112 can be achieved by conventional wafer bonding process, such as dielectric-to-dielectric bonding or Cu-to-Cu bonding.

Accordingly, the carrier wafer 1112 may include silicon oxide layers or SiCN layers, or any other layers applicable in the direct bonding technology applied in state of the art packaging techniques. Bonding of the device wafer to the carrier wafer 1112 takes place by such known direct bonding techniques, thus obtaining the assembly shown in FIGS. 12A-12C after the wafer is flipped.

Figure 12A:
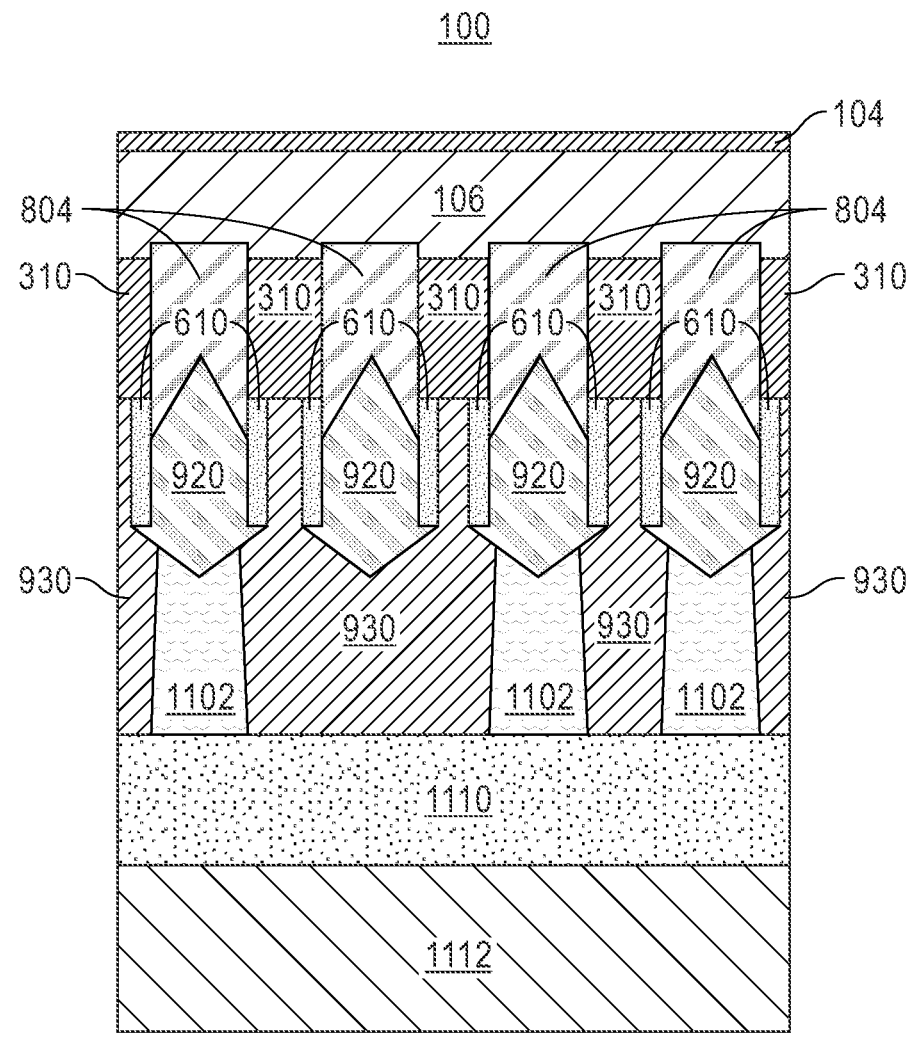
FIG. 12A is a cross-sectional view of the semiconductor structure taken along Y1-Y1', as shown in FIG. 1, depicting substrate grinding, according to an embodiment of the present disclosure.
Figure 12C:
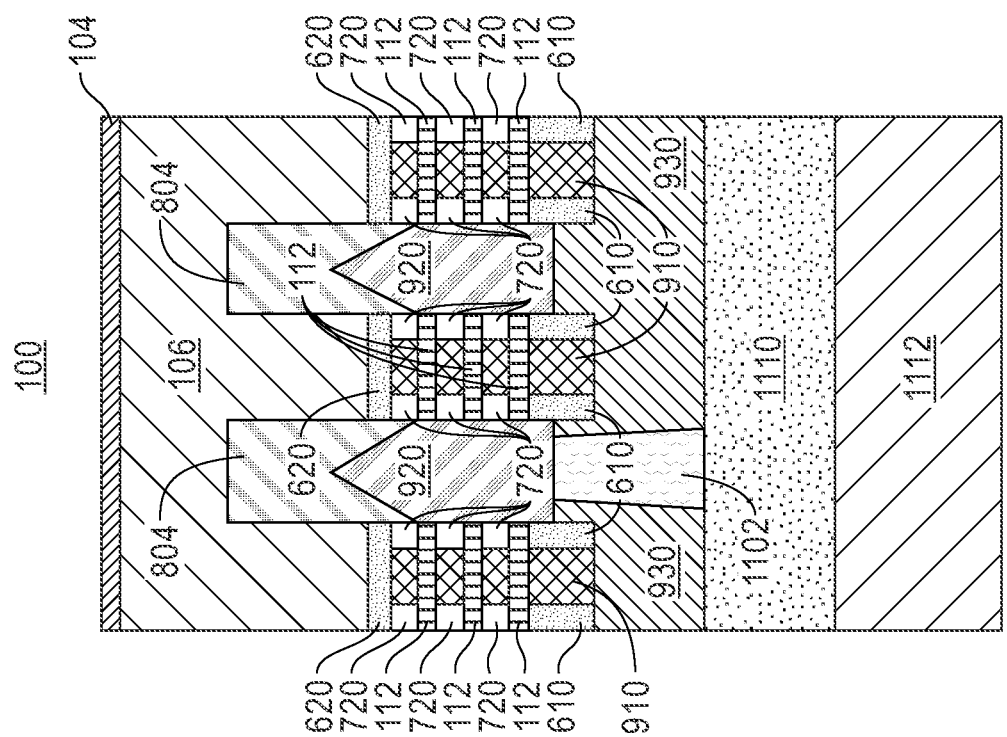
FIG. 12C is a cross-sectional view of the semiconductor structure taken along line X-X', according to an embodiment of the present disclosure.
Figure 12B:
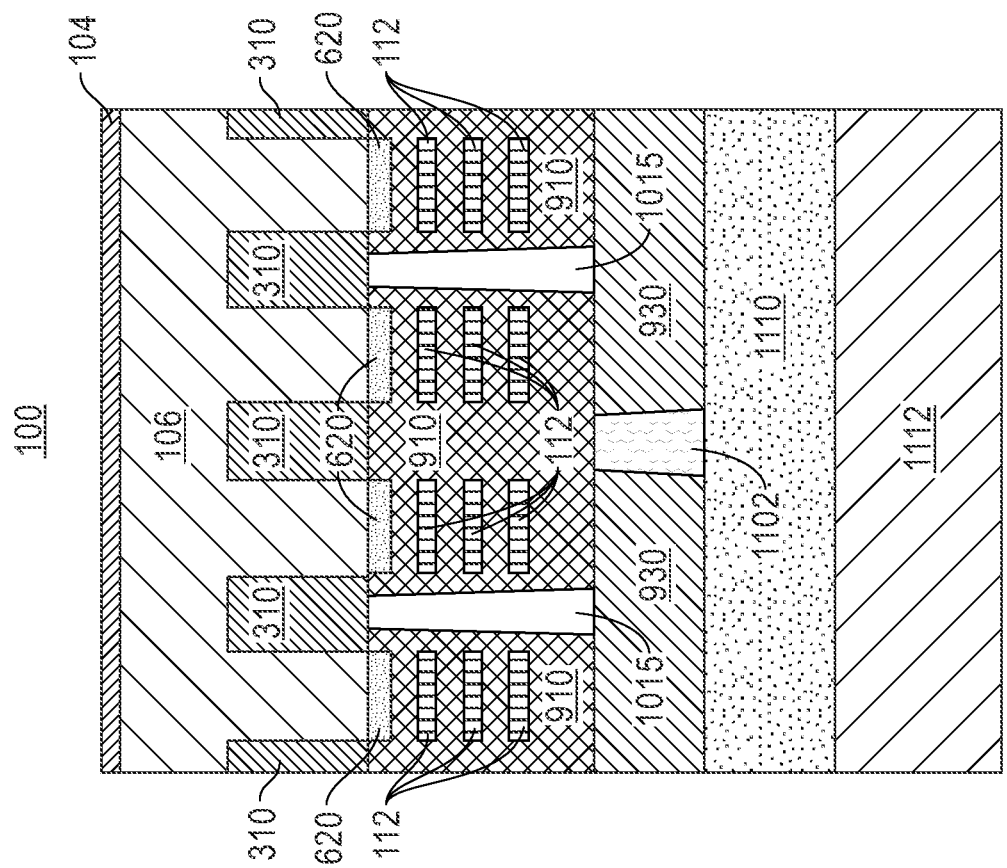
FIG. 12B is a cross-sectional view of the semiconductor structure taken along line Y2-Y2', as shown in FIG. 1, according to an embodiment of the present disclosure.

Referring now to FIGS. 12A-12C, cross-sectional views of the semiconductor structure 100 are shown after wafer flipping and removal of the substrate 102 (FIGS. 11A-11C), according to an embodiment of the present disclosure. In this embodiment, FIG. 12A is a cross-sectional view of the semiconductor structure 100 taken along line Y1-Y1', as depicted in FIG. 1; FIG. 12B is a cross-sectional view of the semiconductor structure 100 taken along line Y2-Y2', as depicted in FIG. 1; and FIG. 12C is a cross-sectional view of the semiconductor structure 100 taken along line X-X', as depicted in FIG. 1.

In the depicted embodiment, the wafer is flipped, and the substrate 102 (FIGS. 121-121) is subsequently removed using regular grinding, CMP and selective etching processes including wet or dry etching techniques. According to an embodiment, the grinding process is conducted until substantially removing the substrate 102 from the semiconductor structure 100 and only a few microns of Si remains. After that, an optional CMP process can be further used to reduce the thickness variation, and finally a highly selective Si etching process is used to remove the remaining substrate 102 from the semiconductor structure 100. In the depicted embodiment, the first sacrificial layer 104 act as an etch stop during the highly selective Si removal process, preventing excessive Si etch which may damage the replacement gate 910 and source/drain regions 920.

Figure 13A:
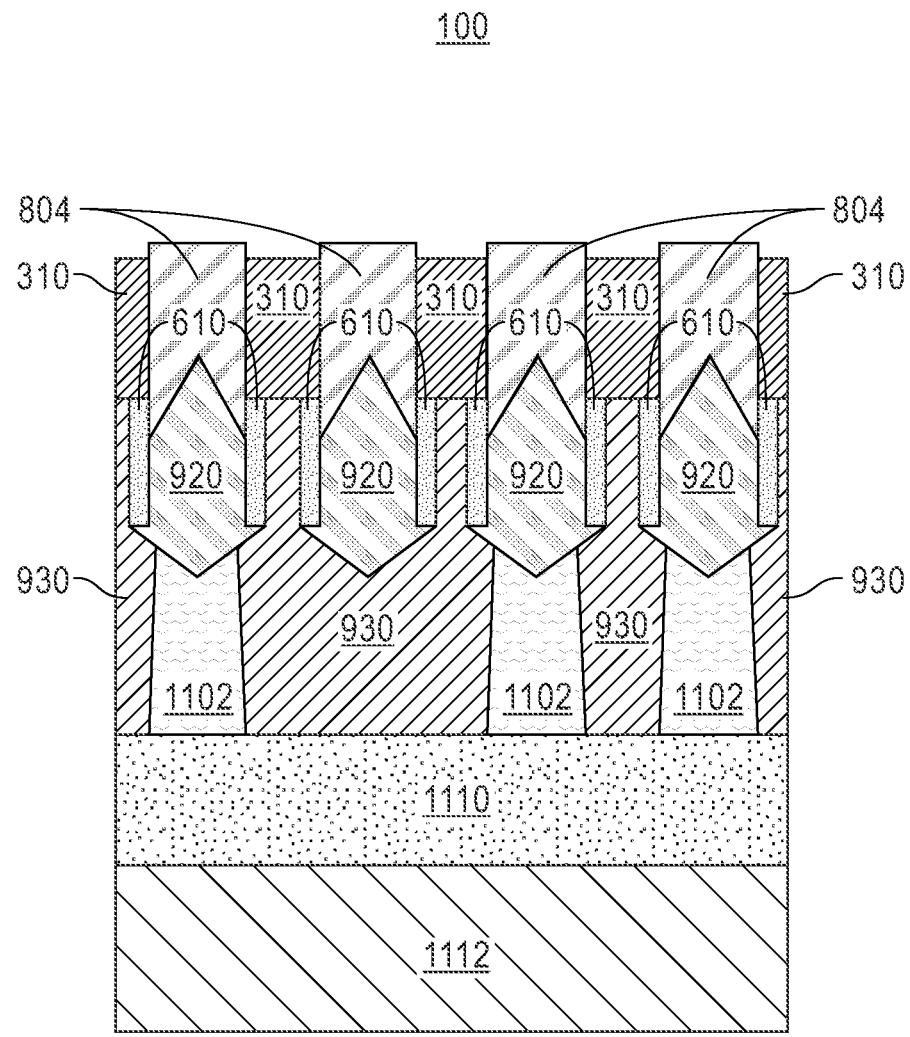
FIG. 13A is a cross-sectional view of the semiconductor structure taken along Y1-Y1', as shown in FIG. 1, depicting removing a first sacrificial layer and the first semiconductor layer, according to an embodiment of the present disclosure.
Figure 13C:
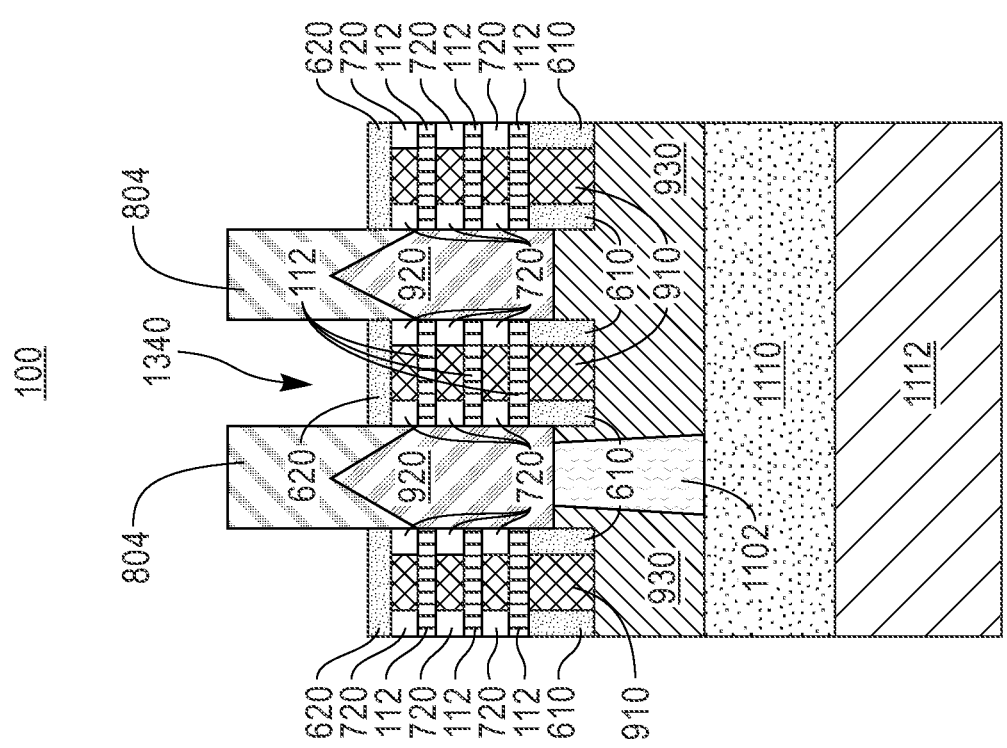
FIG. 13C is a cross-sectional view of the semiconductor structure taken along line X-X', according to an embodiment of the present disclosure.
Figure 13B:
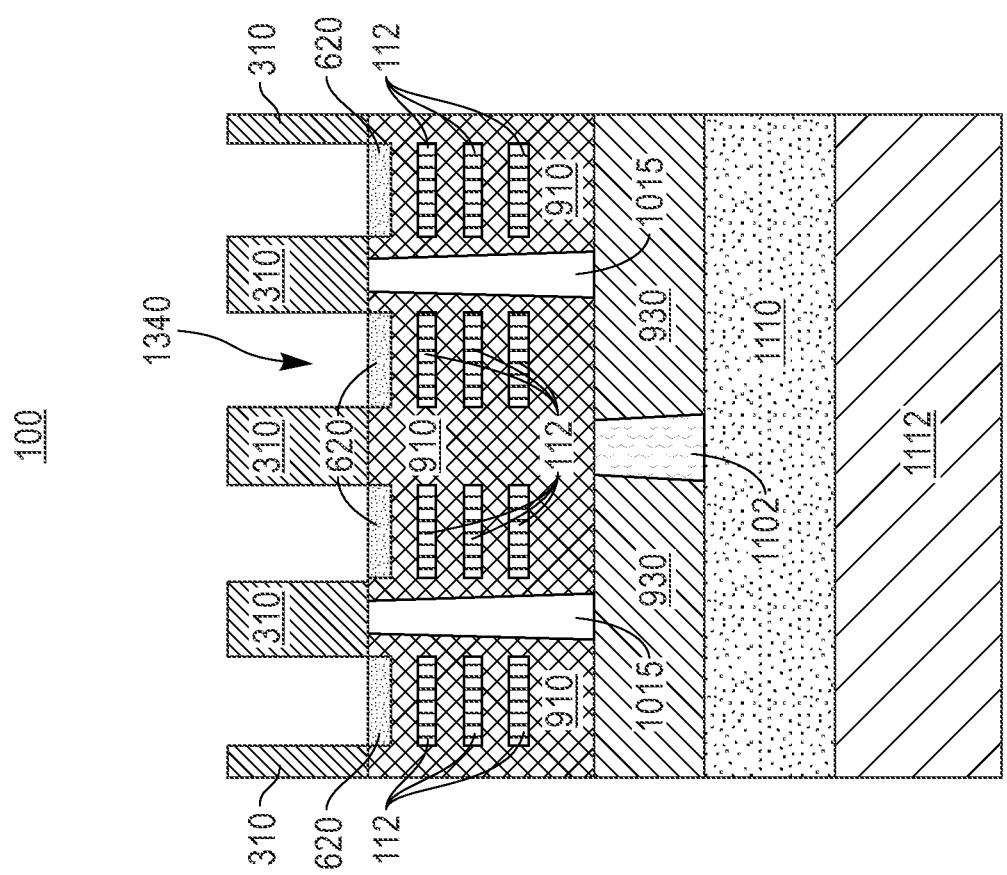
FIG. 13B is a cross-sectional view of the semiconductor structure taken along line Y2-Y2', as shown in FIG. 1, according to an embodiment of the present disclosure.

Referring now to FIGS. 13A-13C, cross-sectional views of the semiconductor structure 100 are shown after removing the first sacrificial layer 104 and remaining Si-containing areas, i.e., the first semiconductor layer 106 depicted in FIGS. 12A-12C, according to an embodiment of the present disclosure. In this embodiment, FIG. 13A is a cross-sectional view of the semiconductor structure 100 taken along line Y1-Y1', as depicted in FIG. 1; FIG. 13B is a cross-sectional view of the semiconductor structure 100 taken along line Y2-Y2', as depicted in FIG. 1; and FIG. 13C is a cross-sectional view of the semiconductor structure 100 taken along line X-X', as depicted in FIG. 1.

In the depicted embodiment, any suitable etching technique may be used to remove the first sacrificial layer 104 (FIGS. 12A-12C). In embodiments in which the first sacrificial layer 104 (FIGS. 12A-12C) is made of SiGe a hot SC1 or dry HCl etch can be used to remove the first sacrificial layer 104. In embodiments in which the first sacrificial layer 104 (FIGS. 12A-12C) is made of $SiO_2$, DHF wet clean can be used to remove the first sacrificial layer 104. After removing the first sacrificial layer 104 (FIGS. 12A-12C), a process similar to the one described in FIGS. 12A-12C for removing the substrate 102 can be conducted to remove the first semiconductor layer 106 (FIGS. 12A-12C). In this embodiment, the bottom dielectric isolation 620 act as an etch stop during the highly selective Si removal process. This may prevent excessive Si etch which may damage the replacement gate 910 and the source/drain regions 920.

Figure 14A:
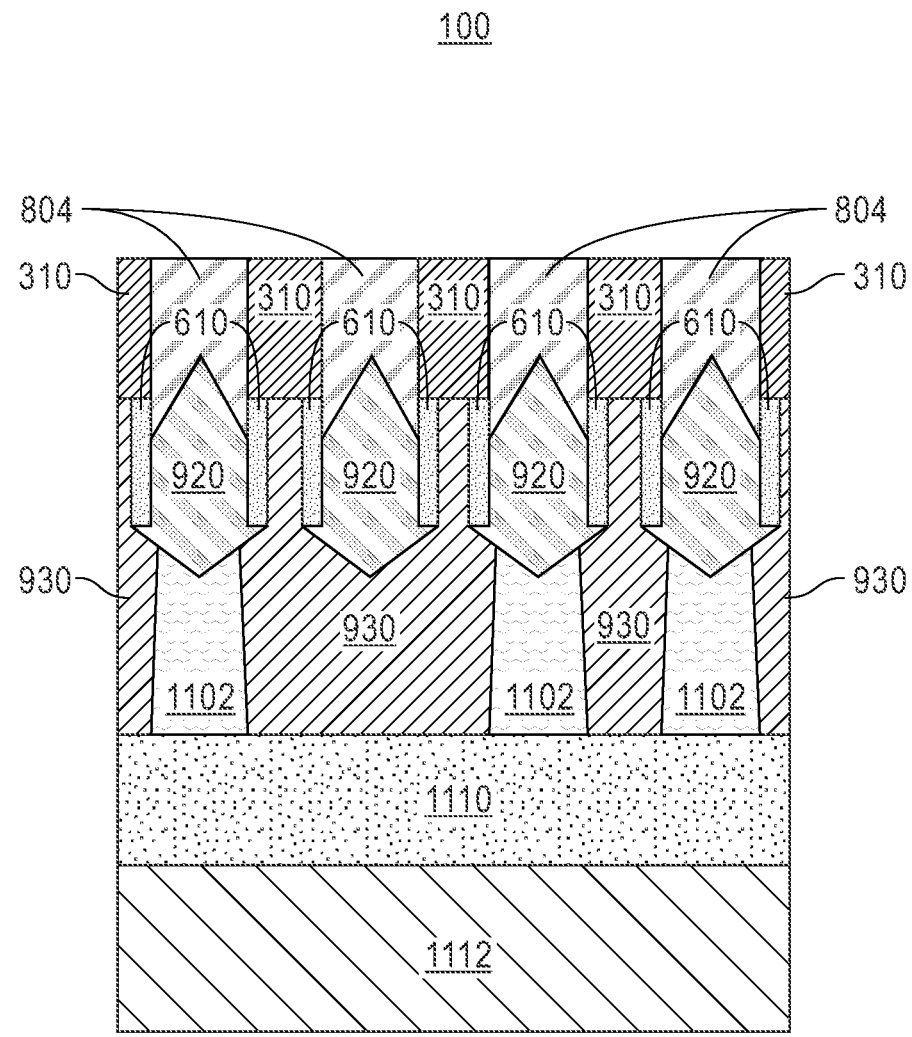
FIG. 14A is a cross-sectional view of the semiconductor structure taken along Y1-Y1', as shown in FIG. 1, depicting forming a backside interlayer dielectric, according to an embodiment of the present disclosure.
Figure 14C:
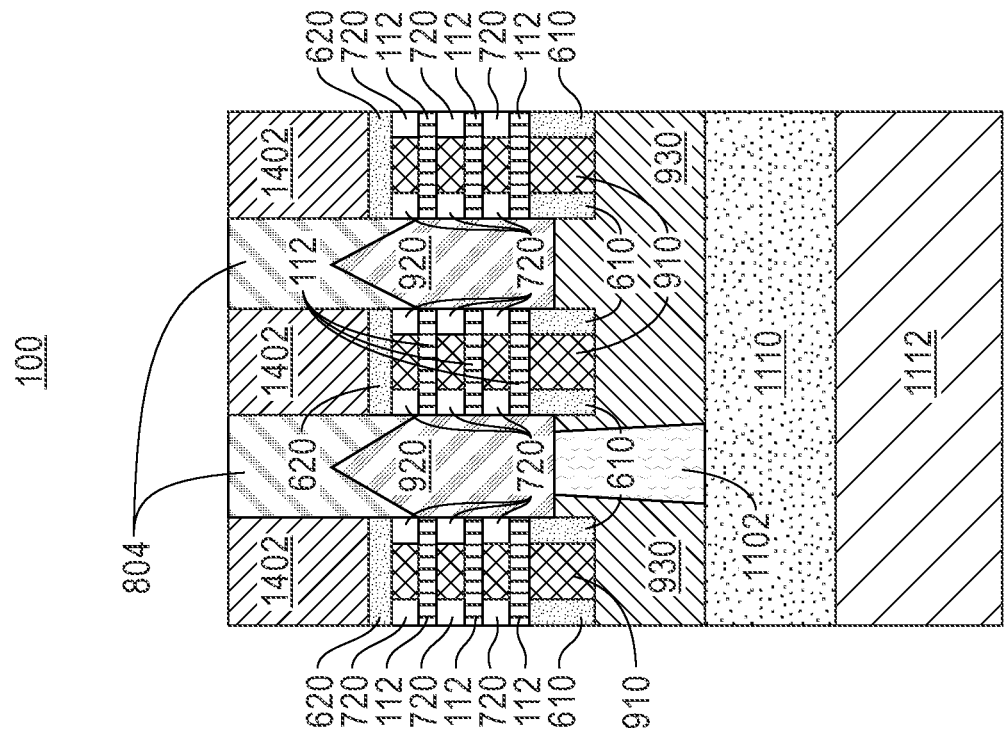
FIG. 14C is a cross-sectional view of the semiconductor structure taken along line X-X', according to an embodiment of the present disclosure.
Figure 14B:
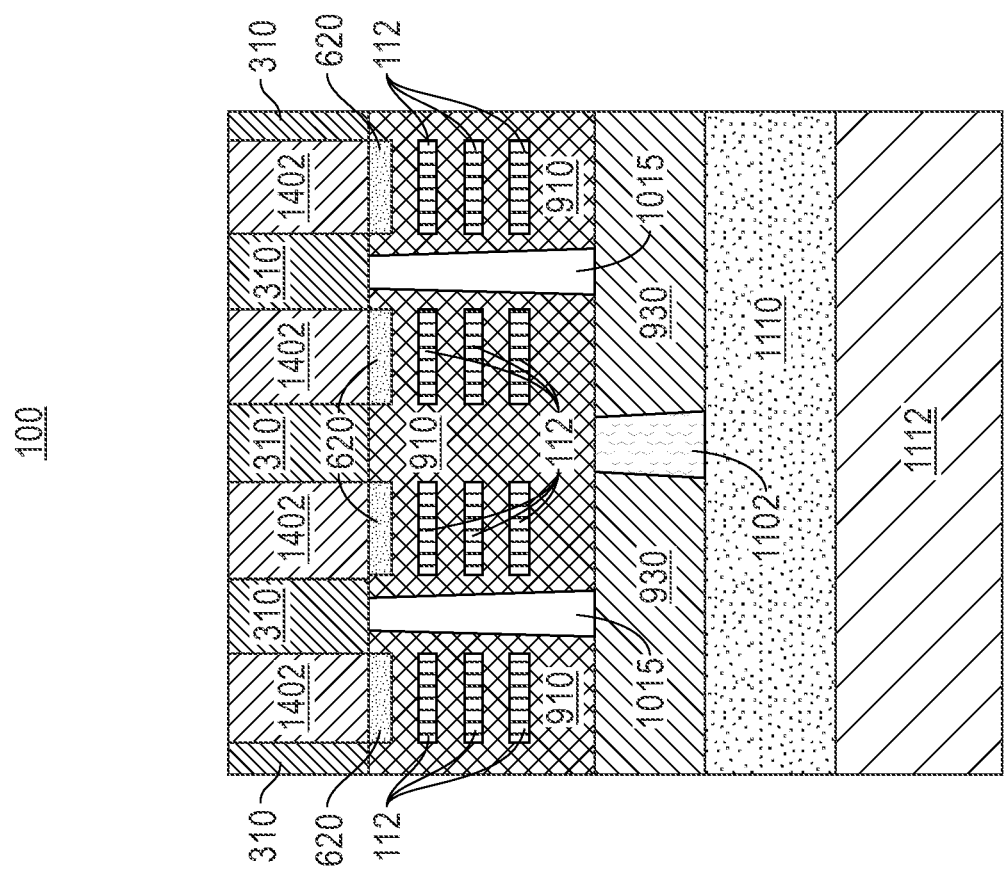
FIG. 14B is a cross-sectional view of the semiconductor structure taken along line Y2-Y2', as shown in FIG. 1, according to an embodiment of the present disclosure.

Referring now to FIGS. 14A-14C, cross-sectional views of the semiconductor structure 100 are shown after forming a first backside interlayer dielectric (BILD) 1402, according to an embodiment of the present disclosure. In this embodiment, FIG. 14A is a cross-sectional view of the semiconductor structure 100 taken along line Y1-Y1', as depicted in FIG. 1; FIG. 14B is a cross-sectional view of the semiconductor structure 100 taken along line Y2-Y2', as depicted in FIG. 1; and FIG. 14C is a cross-sectional view of the semiconductor structure 100 taken along line X-X', as depicted in FIG. 1.

The first BILD 1402 is formed using standard methods and materials, such as those used to form the interlevel dielectric layer 930 described above with reference to FIGS. 10A-10C. As depicted in FIGS. 14B-14C, the first BILD 1402 is disposed above the bottom dielectric isolation layer 620. In an exemplary embodiment, a thickness of the first BILD 1402 may vary between approximately 40 nm to approximately 300 nm, and ranges therebetween. In one or more embodiments, a planarization process (e.g., CMP) can be conducted on the semiconductor structure 100 after forming the first BILD 1402.

Figure 15A:
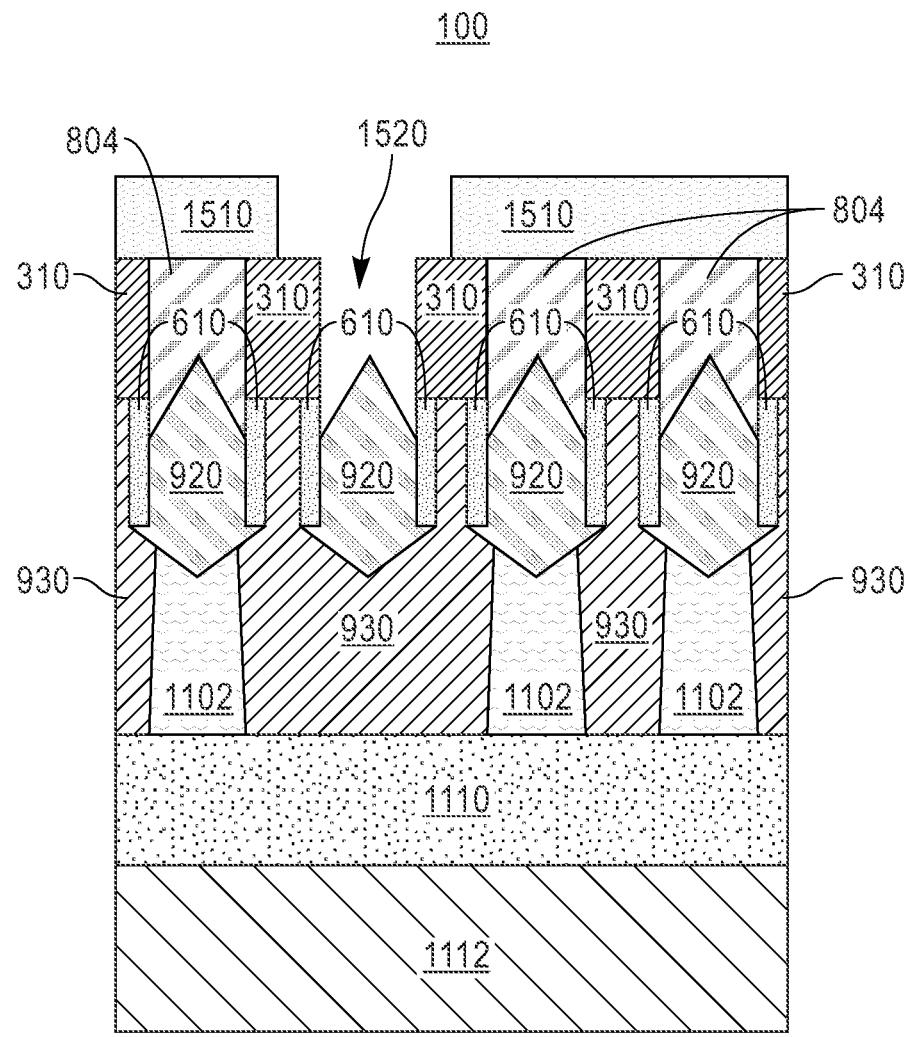
FIG. 15A is a cross-sectional view of the semiconductor structure taken along Y1-Y1', as shown in FIG. 1, depicting backside contact patterning, according to an embodiment of the present disclosure.
Figure 15C:
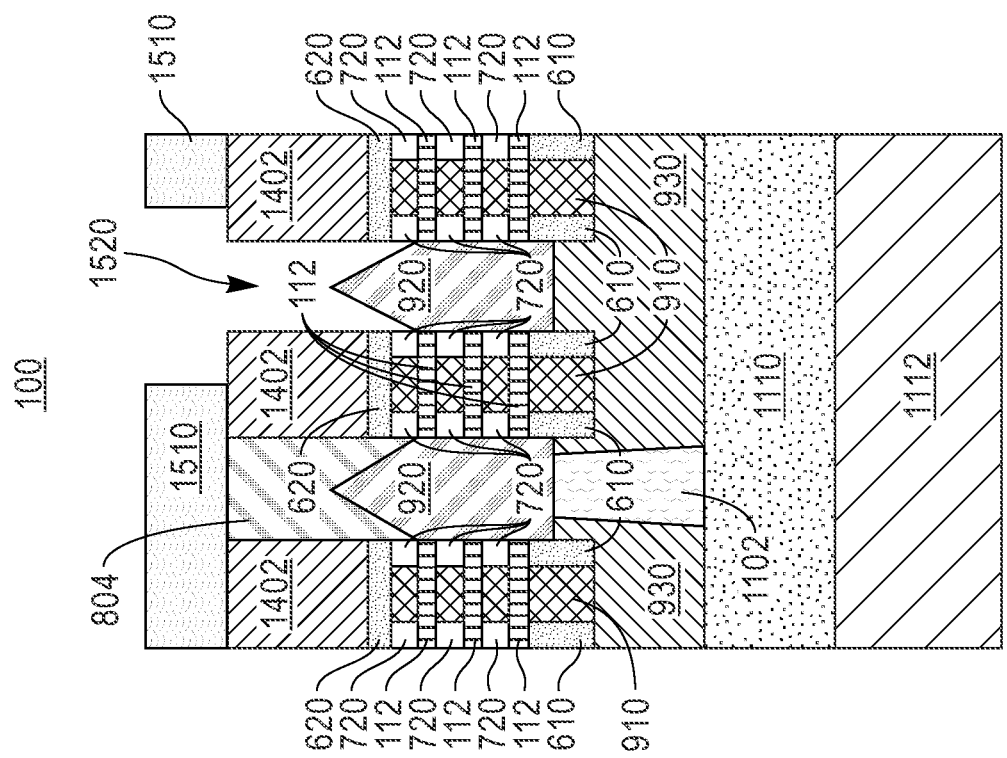
FIG. 15C is a cross-sectional view of the semiconductor structure taken along line X-X', according to an embodiment of the present disclosure.
Figure 15B:
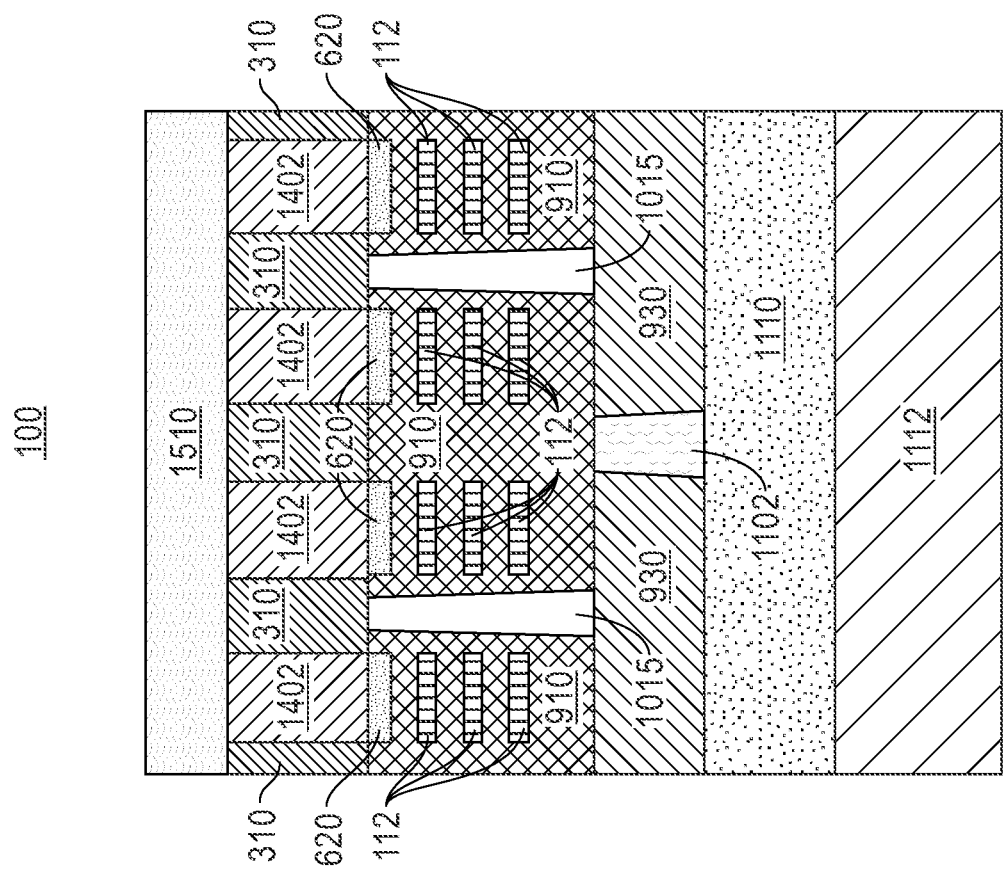
FIG. 15B is a cross-sectional view of the semiconductor structure taken along line Y2-Y2', as shown in FIG. 1, according to an embodiment of the present disclosure.

Referring now to FIGS. 15A-15C, cross-sectional views of the semiconductor structure 100 are shown after backside contact patterning, according to an embodiment of the present disclosure. In this embodiment, FIG. 15A is a cross-sectional view of the semiconductor structure 100 taken along line Y1-Y1', as depicted in FIG. 1; FIG. 15B is a cross-sectional view of the semiconductor structure 100 taken along line Y2-Y2', as depicted in FIG. 1; and FIG. 15C is a cross-sectional view of the semiconductor structure 100 taken along line X-X', as depicted in FIG. 1.

According to an embodiment, an organic planarization layer (OPL), or simply planarization layer 1510 can be deposited on the semiconductor structure 100. The planarization layer 1510 can be made of any organic planarizing material that is capable of effectively preventing damage of underlying layers during subsequent etching processes. The planarization layer 1510 can include, but is not necessarily limited to, an organic polymer including C, H, and N. In an embodiment, the organic planarizing material can be free of silicon (Si). In another embodiment, the organic planarizing material can be free of Si and fluorine (F). As defined herein, a material is free of an atomic element when the level of the atomic element in the material is at or below a trace level detectable with analytic methods available in the art. Non-limiting examples of organic planarizing materials for forming the planarization layer 1510 may include JSR HM8006, JSR HM8014, AZ UM10M2, Shin Etsu ODL 102, or other similar commercially available materials. The planarization layer 1510 may be deposited by, for example, spin coating.

With continued reference to FIGS. 15A-15C, a lithography process followed by an etching process is conducted on the semiconductor structure 100 for etching the planarization layer 1510 and removing a portion of the first epitaxial layer 804 to form third openings 1520, as shown in the figure. In some embodiments, etching the planarization layer 1510 can be conducted by, for example, an OPL RIE including a trace point detection. Similarly, removal of the portion of the first epitaxial layer 804 can be conducted by a selective etching process with respect to source/drain regions 920, STI regions 310, and first BILD 1402.

As can be observed in FIGS. 15A and 15C, at least one of the third openings 1520 expose a top surface of a source/drain region 920 adjacent to another source/drain region 920 that is in electric contact with a metal contact 1102. A top surface of the adjacent source/drain region(s) 920 remains in contact with the first epitaxial layer 804. In one or more embodiments, a location of the third openings 1520 can be selected based on the desired location of subsequently formed backside metal contacts.

Figure 16A:
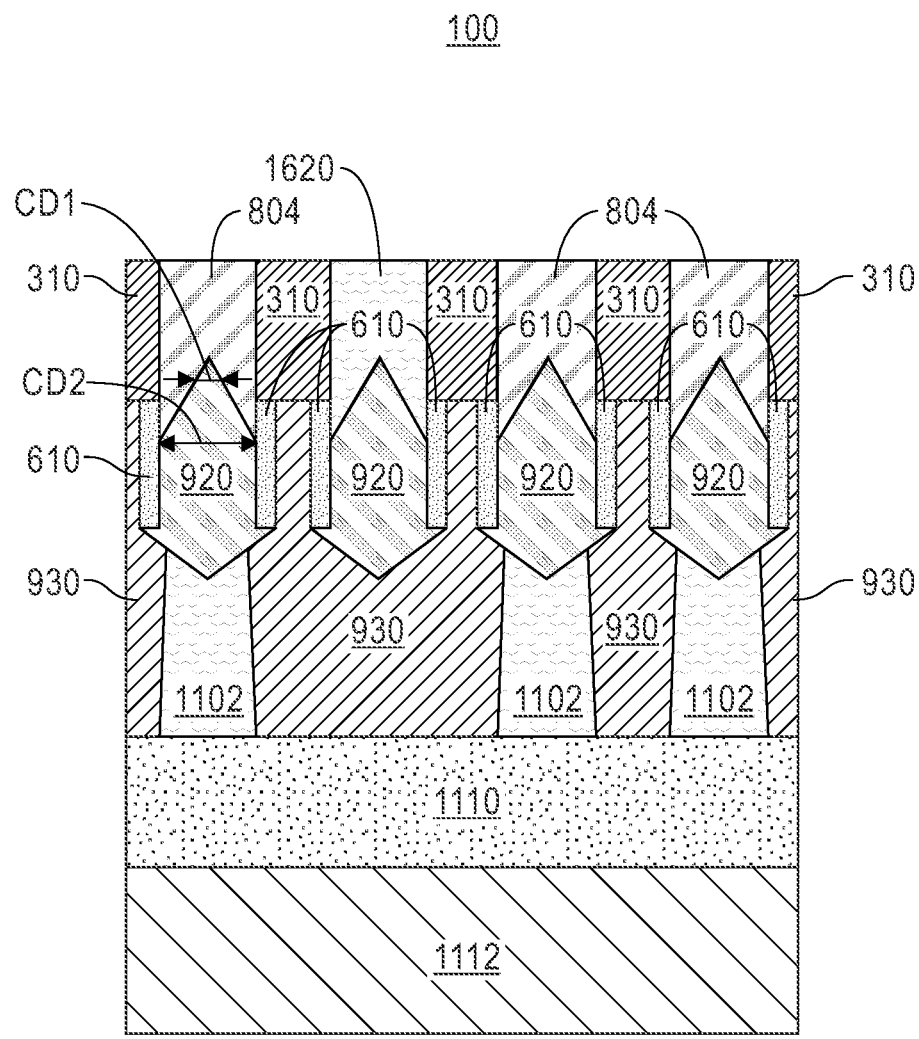
FIG. 16A is a cross-sectional view of the semiconductor structure taken along Y1-Y1', as shown in FIG. 1, depicting forming backside contacts, according to an embodiment of the present disclosure.

Referring now to FIGS. 16A-16C, cross-sectional views of the semiconductor structure 100 are shown after forming backside contacts 1620, according to an embodiment of the present disclosure. In this embodiment, FIG. 16A is a cross-sectional view of the semiconductor structure 100 taken along line Y1-Y1', as depicted in FIG. 1; FIG. 16B is a cross-sectional view of the semiconductor structure 100 taken along line Y2-Y2', as depicted in FIG. 1; and FIG. 16C is a cross-sectional view of the semiconductor structure 100 taken along line X-X', as depicted in FIG. 1.

According to an embodiment, the backside contacts 1620 may electrically connect the semiconductor structure 100 to a subsequently formed backside power rail (BPR), as will be described in detail below. The backside contacts 1620 can generally be formed using similar conductive materials and analogous processing techniques as those used to form the metal contacts 1102. In one or more embodiments, the backside contacts 1620 can be formed between neighboring source/drain regions 920 located within NFET (i.e., N2N space) regions 12 (FIG. 1) or PFET (i.e., P2P space) regions 16 (FIG. 1) of the semiconductor structure 100. In the depicted embodiment, the backside metal contact 1620 is formed in direct contact with a top or first surface of the source/drain region 920.

It should be noted that, after the wafer is flipped (FIGS. 12A-12C), the top or first surface of each of the source/drain regions 920 includes an inverted V-shape (or inverted triangle shape) in which two opposite sides of each of the source/drain regions 920 converge to a point in a direction towards the backside of the wafer. Stated differently, each of the source/drain regions 920 includes a pointed shape towards the back of the wafer similar to a peak or tip. More particularly, a critical dimension (CD) of each of the source/drain regions 920 gradually increases from the top (CD1) or first surface of the source/drain regions 920 towards a bottom (CD2) or second surface of the source/drain region 920 opposing the backside of the wafer and in contact with the device channel region. Thus, in the proposed embodiments, the backside contact 1620 wraps around the inverted V-shape or tip-like region of the at least one source/drain region 920 providing an increased contact area between backside contacts 1620 and source/drain regions 920. This may in turn reduce device resistance and improve device performance and reliability.

Figure 17A:
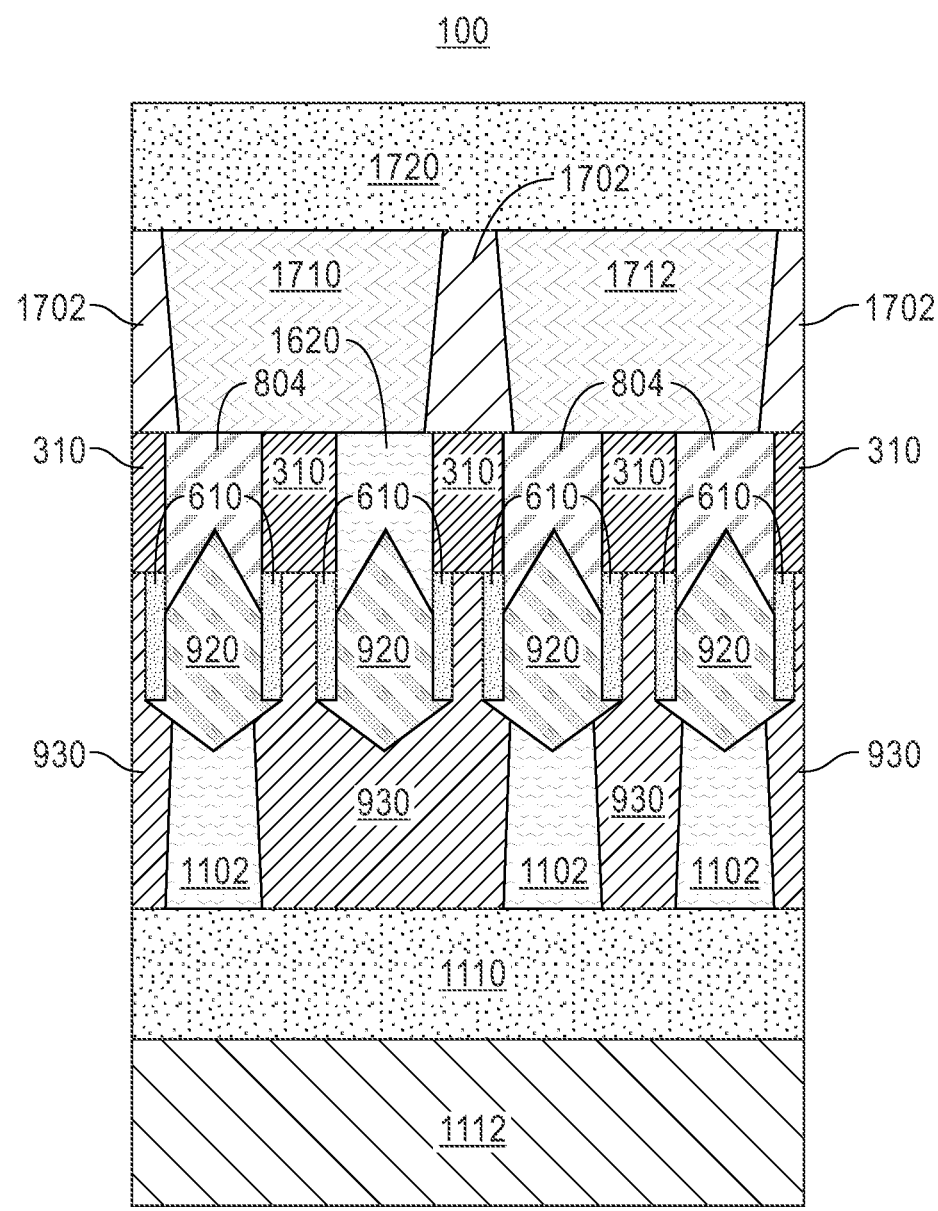
FIG. 17A is a cross-sectional view of the semiconductor structure taken along Y1-Y1', as shown in FIG. 1, depicting backside power rail patterning and metallization, and forming a backside power delivery network, according to an embodiment of the present disclosure.
Figure 17C:
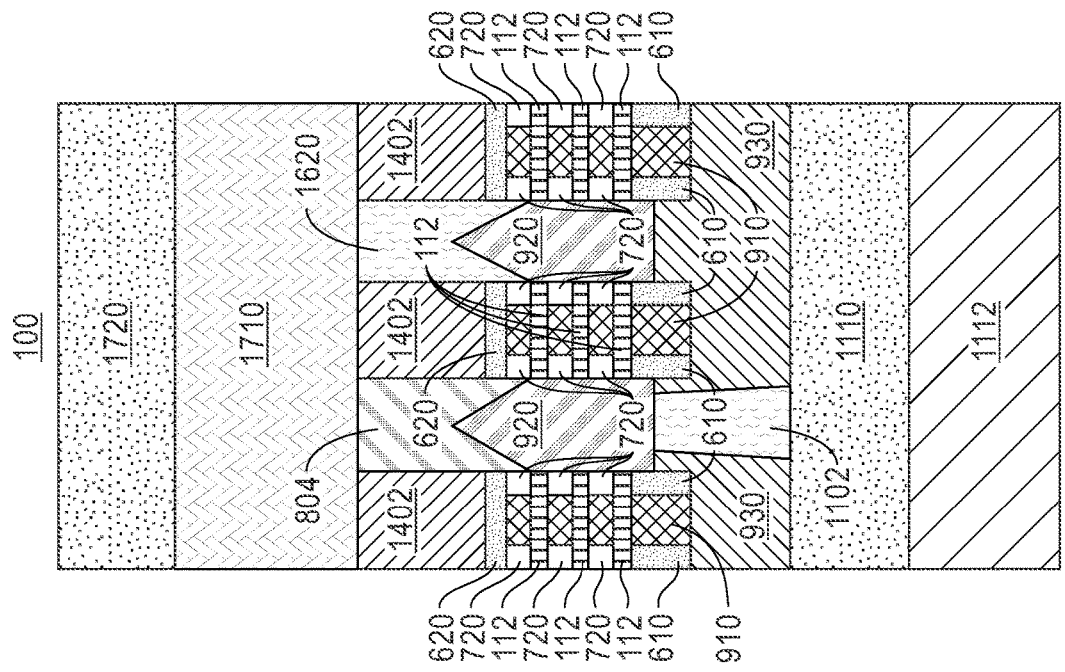
FIG. 17C is a cross-sectional view of the semiconductor structure taken along line X-X', according to an embodiment of the present disclosure.
Figure 17B:
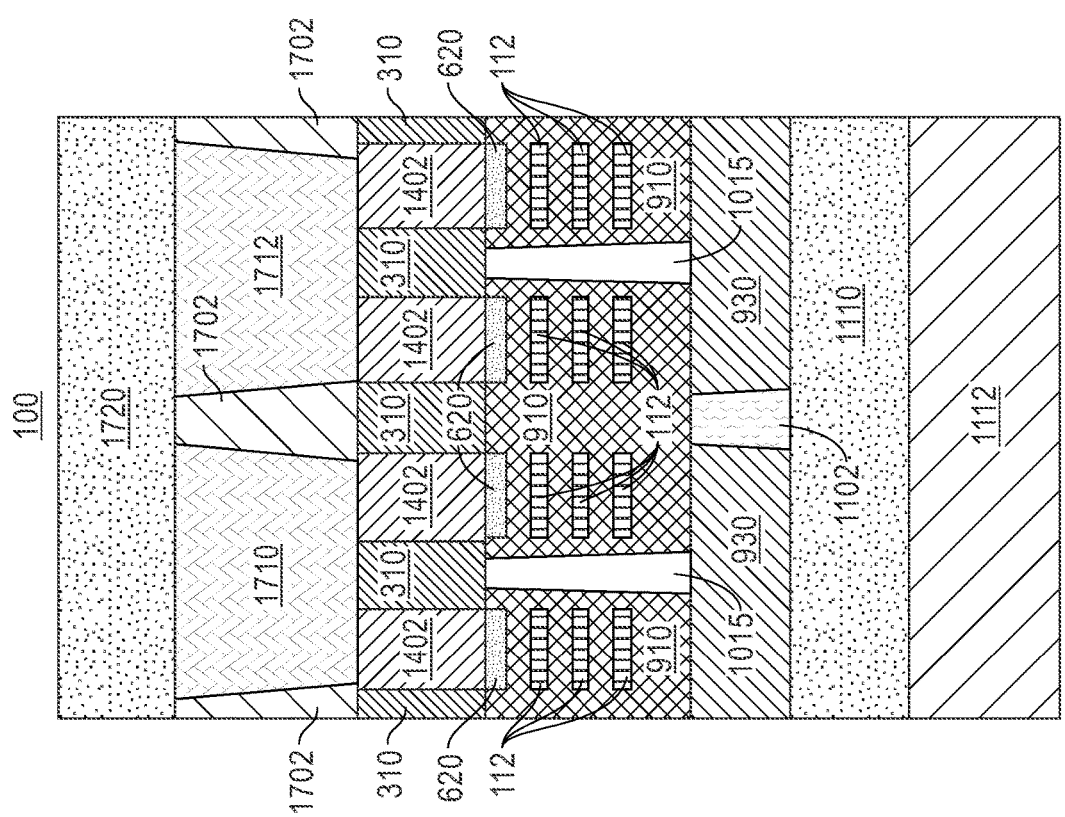
FIG. 17B is a cross-sectional view of the semiconductor structure taken along line Y2-Y2', as shown in FIG. 1, according to an embodiment of the present disclosure.

Referring now to FIGS. 17A-17C, cross-sectional views of the semiconductor structure 100 are shown after backside power rail patterning and metallization, and forming a backside power delivery network (BSPDN), according to an embodiment of the present disclosure. In this embodiment, FIG. 17A is a cross-sectional view of the semiconductor structure 100 taken along line Y1-Y1', as depicted in FIG. 1; FIG. 17B is a cross-sectional view of the semiconductor structure 100 taken along line Y2-Y2', as depicted in FIG. 1; and FIG. 17C is a cross-sectional view of the semiconductor structure 100 taken along line X-X', as depicted in FIG. 1.

In the depicted embodiment, backside power rails (BPRs) 1710, 1712 are formed within a second BILD 1702, substantially similar to the first BILD 1402. The process of forming the BPRs 1710, 1712 includes patterning a backside power rail trench (not shown) in the second BILD 1702, for example, by conventional lithography and reactive ion etching. In the depicted example, the backside power rail trench (not shown) is etched until reaching an uppermost surface of the backside contact 1620, as shown in FIGS. 17A and 17C. In some embodiments, the aspect ratio of the backside power rail trench (not shown) may be about 0.5 to 5.0.

To form the BPRs 1710, 1712, the backside power rail trenches (not shown) can be filled with a conductive metal. The choice of metallization for backside power rails is based on where in the integration flow the rail is formed and metalized. In the depicted embodiment, the BPRs 1710, 1712 are formed in the backside of the semiconductor structure 100. In such instances the BPRs 1710, 1712 may be formed by depositing, for example, a layer of ruthenium (Ru) or Cu. In other embodiments, the conductive metal forming the BPRs 1710, 1712 may include Co, W, Al, and the like. According to an embodiment, the backside BPRs 1710 is electrically connected to the backside contact 1620 for supplying power to the devices (e.g., field effect transistors) in the FEOL level 30 (FIGS. 11A-11C).

More particularly, in the depicted embodiment, the semiconductor structure 100 includes a PFET device in which the BPR 1710 may include a VDD rail embedded in the PFET region of the semiconductor structure 100 that is electrically connected to a (P-type) source/drain region 920 through the backside contact 1620 (located between adjacent P-type source/drain regions 920). It may be understood that, although not depicted in the figures, in embodiments in which the semiconductor structure 100 is an NFET device, the BPR 1712 includes a VSS rail embedded in the NFET region of the semiconductor structure 100 that is electrically connected to an N-type source/drain region 920 through a backside contact 1620 (located between adjacent N-type source/drain regions 920).

It should be noted that source/drain regions 920 wired to the backside power rails (i.e., BPRs 1710,1712) are not connected to the BEOL interconnect level 1110. More particularly, as depicted in the figures, at least one backside power rail (i.e., BPRs 1710,1712) electrically connects to a source/drain region 920 of a transistor through the backside contact 1620, with the first epitaxial layer 804 in contact with remaining source/drain regions 920 for electrically isolating the at least one backside power rail from the source/drain regions 920 not electrically connected to the backside contact 1620.

With continued reference to FIGS. 17A-17C, the structure of the BSPDN 1720 can be made according to known techniques. Depending on the exact function of the transistor arrangement, a number of the source/drain regions 920 may be connected to backside power and ground via the backside contact 1620. As mentioned above, the backside contact 1620 is a metal area placed between P-type source/drain regions (N2N space) and between N-type source/drain regions (N2N space), i.e., between source/drain regions of similar polarity. According to an embodiment, the backside contact 1620 is in contact with a bottom surface of the BPR 1710 or 1712 (depending on the polarity of the device), and embedded in an intermediate STI region 310 (located between same polarity regions).

It should be noted that the BEOL interconnect level 1110 in the semiconductor structure 100 manufactured according to the disclosed technology is separated from the BSPDN 1720, thereby increasing the routing resources in the semiconductor structure 100 for signal wirings in the BEOL level.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a plurality of source/drain regions within a field effect transistor, each of the plurality of source/drain regions including a top portion having a non-curved inverted V-shaped area;
    a backside power rail electrically connected to at least one source/drain region through a backside metal contact, the backside metal contact wrapping around a top portion of the at least one source/drain region, a tip of the top portion of the plurality of source/drain regions pointing towards the backside power rail, the top portion of the at least one source/drain region being in electric contact with the backside metal contact; and
    a first epitaxial layer being in contact with a top portion of at least another source/drain region adjacent to the at least one source/drain region for electrically isolating the at least another source/drain region from the backside power rail.

2. The semiconductor structure of claim 1, further comprising:
    a front-end-of-line level including the field effect transistor, the front-end-of-line level electrically connected to a back-end-of-line interconnect level located on a first side of the front-end-of-line level;
    a plurality of shallow trench isolation regions located between adjacent field effect transistors;
    a backside interlayer dielectric surrounding the backside power rail and located on a second side of the front-end-of-line level opposing the first side of the front-end-of-line level; and
    a metal contact within an interlevel dielectric layer and in electric contact with a bottom portion of the at least another source/drain region.

3. The semiconductor structure of claim 2, further comprising:
    a carrier wafer in contact with a surface of the back-end-of-line interconnect level opposing the plurality of source/drain regions and the metal contact.

4. The semiconductor structure of claim 1, wherein the non-curved inverted V-shaped area comprises two opposite sides of each of the plurality of source/drain regions converging to a point in a direction towards a backside of a wafer.

5. The semiconductor structure of claim 4, wherein a critical dimension of each of the plurality of source/drain regions gradually increases from the top portion of each of the plurality of source/drain regions towards a bottom portion of each of the plurality of source/drain regions opposing the backside of the wafer and being in contact with a channel region of the field effect transistor.

6. The semiconductor structure of claim 1, wherein the first epitaxial layer being in contact with the top portion of the at least another source/drain region adjacent to the at least one source/drain region comprises a first surface in contact with the backside power rail and a second surface in contact with the top portion of the at least another source/drain region, the second surface being shaped as an inverted V for providing the non-curved inverted V-shaped area to the top portion of the plurality of source/drain regions.

7. The semiconductor structure of claim 1, wherein the first epitaxial layer comprises an epitaxially grown layer of silicon-germanium.

8. The semiconductor structure of claim 1, further comprising:
a power delivery network above and in electric contact the backside power rail.

9. The semiconductor structure of claim 1, wherein the field effect transistor includes at least one of a P-field effect transistor and an N-field effect transistor.

10. The semiconductor structure of claim 1, wherein the field effect transistor includes a nanosheet field effect transistor.

11. A method of forming a semiconductor structure, comprising:
forming a field effect transistor including a plurality of source/drain regions, each of the plurality of source/drain regions including a top portion having a non-curved inverted V-shaped area;
forming a backside power rail electrically connected to at least one source/drain region through a backside metal contact, the backside metal contact wrapping around a top portion of the at least one source/drain region, a tip of the top portion of the plurality of source/drain regions pointing towards the backside power rail, a top portion of the at least one source/drain region being in electric contact with the backside metal contact; and
forming a first epitaxial layer in contact with a top portion of at least another source/drain region adjacent to the at least one source/drain region for electrically isolating the at least another source/drain region from the backside power rail.

12. The method of claim 11, further comprising:
forming a front-end-of-line level including the field effect transistor, the front-end-of-line level being electrically connected to a back-end-of-line interconnect level located on a first side of the front-end-of-line level;
forming a plurality of shallow trench isolation regions between adjacent field effect transistors;
forming a backside interlayer dielectric surrounding the backside power rail and on a second side of the front-end-of-line level opposing the first side of the front-end-of-line level; and
forming a metal contact within an interlevel dielectric layer and in electric contact with a bottom portion of the at least another source/drain region.

13. The method of claim 12, further comprising:
forming a carrier wafer in contact with a surface of the back-end-of-line interconnect level opposing the plurality of source/drain regions and the metal contact.

14. The method of claim 11, wherein the non-curved inverted V-shaped area comprises two opposite sides of each of the plurality of source/drain regions converging to a point in a direction towards a backside of a wafer.

15. The method of claim 14, wherein a critical dimension of each of the plurality of source/drain regions gradually increases from the top portion of each of the plurality of source/drain regions towards a bottom portion of each of the plurality of source/drain regions opposing the backside of the wafer and being in contact with a channel region of the field effect transistor.

16. The method of claim 11, wherein the first epitaxial layer being in contact with the top portion of the at least another source/drain region adjacent to the at least one source/drain region comprises a first surface in contact with the backside power rail and a second surface in contact with the top portion of the at least another source/drain region, the second surface being shaped as an inverted V for providing the non-curved inverted V-shaped area to the top portion of the plurality of source/drain regions.

17. The method of claim 11, wherein the first epitaxial layer comprises an epitaxially grown layer of silicon-germanium.

18. The method of claim 11, further comprising:
forming a power delivery network above and in electric contact with the backside power rail.

19. The method of claim 11, wherein the field effect transistor includes at least one of a P-field effect transistor and an N-field effect transistor.

20. The method of claim 11, wherein the field effect transistor includes a nanosheet field effect transistor.

* * * * *